US010245623B2

United States Patent
Swanson et al.

(10) Patent No.: US 10,245,623 B2
(45) Date of Patent: Apr. 2, 2019

(54) CONTAMINATION REMOVAL APPARATUS AND METHOD

(71) Applicant: Rave N.P., Inc., Delray Beach, FL (US)

(72) Inventors: Gordon Scott Swanson, Livermore, CA (US); Ivin Varghese, Livermore, CA (US); Mehdi Balooch, Berkeley, CA (US)

(73) Assignee: RAVE N.P., INC., Delray Beach, FL (US)

( * ) Notice: Subject to any disclaimer, the term of this patent is extended or adjusted under 35 U.S.C. 154(b) by 806 days.

(21) Appl. No.: 13/897,552

(22) Filed: May 20, 2013

(65) Prior Publication Data

US 2013/0306101 A1 Nov. 21, 2013

Related U.S. Application Data

(60) Provisional application No. 61/649,012, filed on May 18, 2012.

(51) Int. Cl.
*H01L 21/00* (2006.01)
*B08B 7/04* (2006.01)
(Continued)

(52) U.S. Cl.
CPC .............. *B08B 7/04* (2013.01); *B08B 7/0021* (2013.01); *B08B 7/0035* (2013.01);
(Continued)

(58) Field of Classification Search
CPC ................................................. B08B 7/0021
(Continued)

(56) References Cited

U.S. PATENT DOCUMENTS 2,595,150 A * 4/1952 Lemeshka ............... H01J 19/36
165/104.33
2,816,241 A * 12/1957 Zunick .................... H01J 35/12
313/32
(Continued)

FOREIGN PATENT DOCUMENTS

CN 102242375 A 11/2011
JP 2000348848 A * 12/2000
(Continued)

OTHER PUBLICATIONS

Balooch, M. et al., "Reactions of modulated molecular beams with pyrolytic graphite. III. Hydrogen," The Journal of Chemical Physics, vol. 63, No. 11 (1975), pp. 4772-4786.
(Continued)

*Primary Examiner* — Sylvia MacArthur
*Assistant Examiner* — Michelle Crowell
(74) *Attorney, Agent, or Firm* — BakerHostetler

(57) ABSTRACT

A substrate dry cleaning apparatus, a substrate dry cleaning system, and a method of cleaning a substrate are disclosed. The substrate dry cleaning system includes a substrate support and a reactive species generator. The reactive species generator includes a first conduit defining a first flow channel that extends to an outlet of the first conduit, the outlet of the first conduit facing the substrate support, a first electrode, a second electrode facing the first electrode, the first flow channel disposed between the first electrode and the second electrode, a first inert wall disposed between the first electrode and the first flow channel, and a second inert wall disposed between the second electrode and the first flow channel.

21 Claims, 14 Drawing Sheets

(51) Int. Cl.
*B08B 7/00* (2006.01)
*H01J 37/32* (2006.01)
*H01L 21/67* (2006.01)
*H01L 21/02* (2006.01)

(52) U.S. Cl.
CPC ........ *B08B 7/0092* (2013.01); *H01J 37/3244* (2013.01); *H01J 37/32082* (2013.01); *H01J 37/32091* (2013.01); *H01J 37/32449* (2013.01); *H01L 21/02057* (2013.01); *H01L 21/67028* (2013.01); *H01J 2237/006* (2013.01); *H01J 2237/334* (2013.01); *H01J 2237/335* (2013.01)

(58) Field of Classification Search
USPC .................................................... 156/345.35
See application file for complete search history.

(56) References Cited

U.S. PATENT DOCUMENTS

| | | | |
|---|---|---|---|
| 4,898,058 A | | 2/1990 | Seifert |
| 4,904,362 A | * | 2/1990 | Gaertner ................. C23C 14/16 204/192.12 |
| 4,964,966 A | * | 10/1990 | Moreland ............... C23F 13/02 204/280 |
| 5,147,614 A | * | 9/1992 | Conrad ................... C01B 13/11 422/186.18 |
| 5,953,107 A | | 9/1999 | Li et al. |
| 6,573,980 B2 | | 6/2003 | Wang |
| 8,002,899 B2 | | 8/2011 | Wu et al. |
| 2004/0050685 A1 | * | 3/2004 | Yara .................... C23C 16/4409 204/164 |
| 2004/0053103 A1 | | 3/2004 | Arthur |
| 2004/0182314 A1 | * | 9/2004 | Rosocha ............. B01D 53/323 118/715 |
| 2005/0001527 A1 | * | 1/2005 | Sugiyama ............. C23C 16/505 313/231.31 |
| 2006/0046482 A1 | | 3/2006 | Verhaverbeke |
| 2006/0144427 A1 | * | 7/2006 | Chun ........................ B08B 7/00 134/61 |
| 2006/0156983 A1 | | 7/2006 | Penelon et al. |
| 2006/0257754 A1 | | 11/2006 | Harubayashi et al. |
| 2006/0279222 A1 | * | 12/2006 | Jackson ................ B08B 7/0021 315/111.21 |
| 2007/0075039 A1 | * | 4/2007 | Yashiro ............. H01J 37/32009 216/67 |
| 2008/0264441 A1 | | 10/2008 | Takagi |
| 2011/0132395 A1 | | 6/2011 | Jackson |
| 2011/0132543 A1 | * | 6/2011 | Yu ........................ H05H 1/2406 156/345.35 |
| 2011/0146727 A1 | | 6/2011 | Kalyankar et al. |

FOREIGN PATENT DOCUMENTS

| | | |
|---|---|---|
| JP | 2001-508951 A | 7/2001 |
| JP | 2001-520320 A | 10/2001 |
| JP | 2009-510775 A | 3/2009 |
| JP | 2009-510780 A | 3/2009 |
| JP | 2013-541228 A | 11/2013 |
| WO | 2012058548 A1 | 5/2012 |

OTHER PUBLICATIONS

Moravej, M. et al., "A radio-frequency nonequilibrium atmospheric pressure plasma operating with argon and oxygen," Journal of Applied Physics, vol. 99 (2006), pp. 093305-1-093305-6.

Babayan, S. E. et al., "Deposition of silicon dioxide films with a non-equilibrium atmospheric-pressure plasma jet," Plasma Sources Sci. Technol., vol. 10 (2001), pp. 573-578.

Hughes, G. et al., "Mask Industry Assessment: 2010," edited by M. Warren Montgomery, Wilhelm Maurer, Proc. of SPIE, vol. 7823 (2010), pp. 782303-1-782303-13.

Balooch, M. et al., "Surface site specificity on the basal plane of graphite: 1.06 μm laser damage threshold and reactivity with oxygen between 350 and 2300 K," Journal of Vacuum Science & Technology B9, (1991), pp. 1088-1091.

Chen, J. et al., "Detection and characterization of carbon contamination on EUV multilayer mirrors," Optics Express, vol. 17, No. 19 (2009), pp. 16970-16979.

Varghese, I. et al., "Extending CO2 Cryogenic Aerosol Cleaning for Advanced Optical and EUV Mask Cleaning," Proceedings of the SPIE, vol. 8166 (2011), pp. 816615-1-816615-13.

Boller, K.-J. et al., "Investigation of carbon contamination of mirror surfaces exposed to synchrotron radiation," Nucl. Instrum. Methods Phys. Res., vol. 208, No. 103, (1983), pp. 273-279.

Schutze, A. et al., "The Atmospheric-Pressure Plasma Jet: A Review and Comparison to Other Plasma Sources," IEEE Transactions on Plasma Science (1998), vol. 26, No. 6, pp. 1685-1694.

* cited by examiner

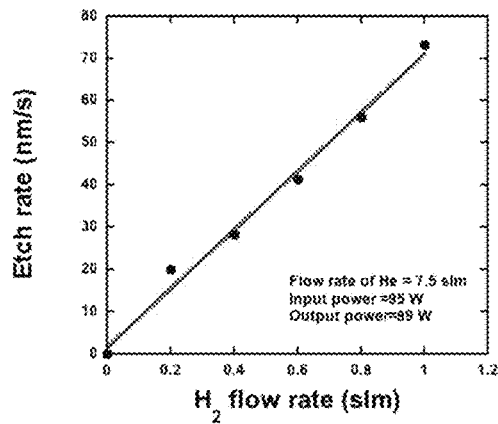 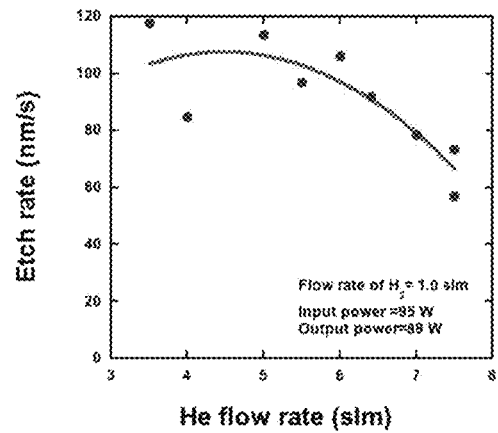
FIG. 7A  FIG. 7B
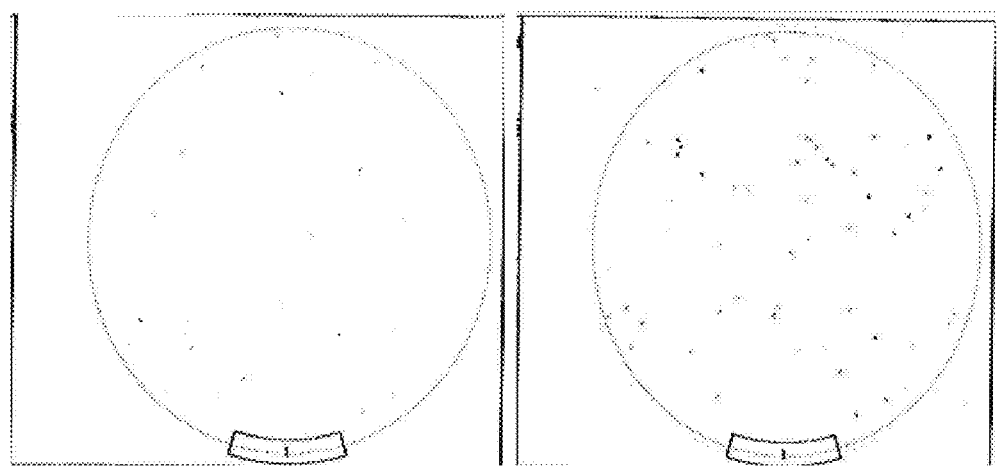
FIG. 18A  FIG. 18B

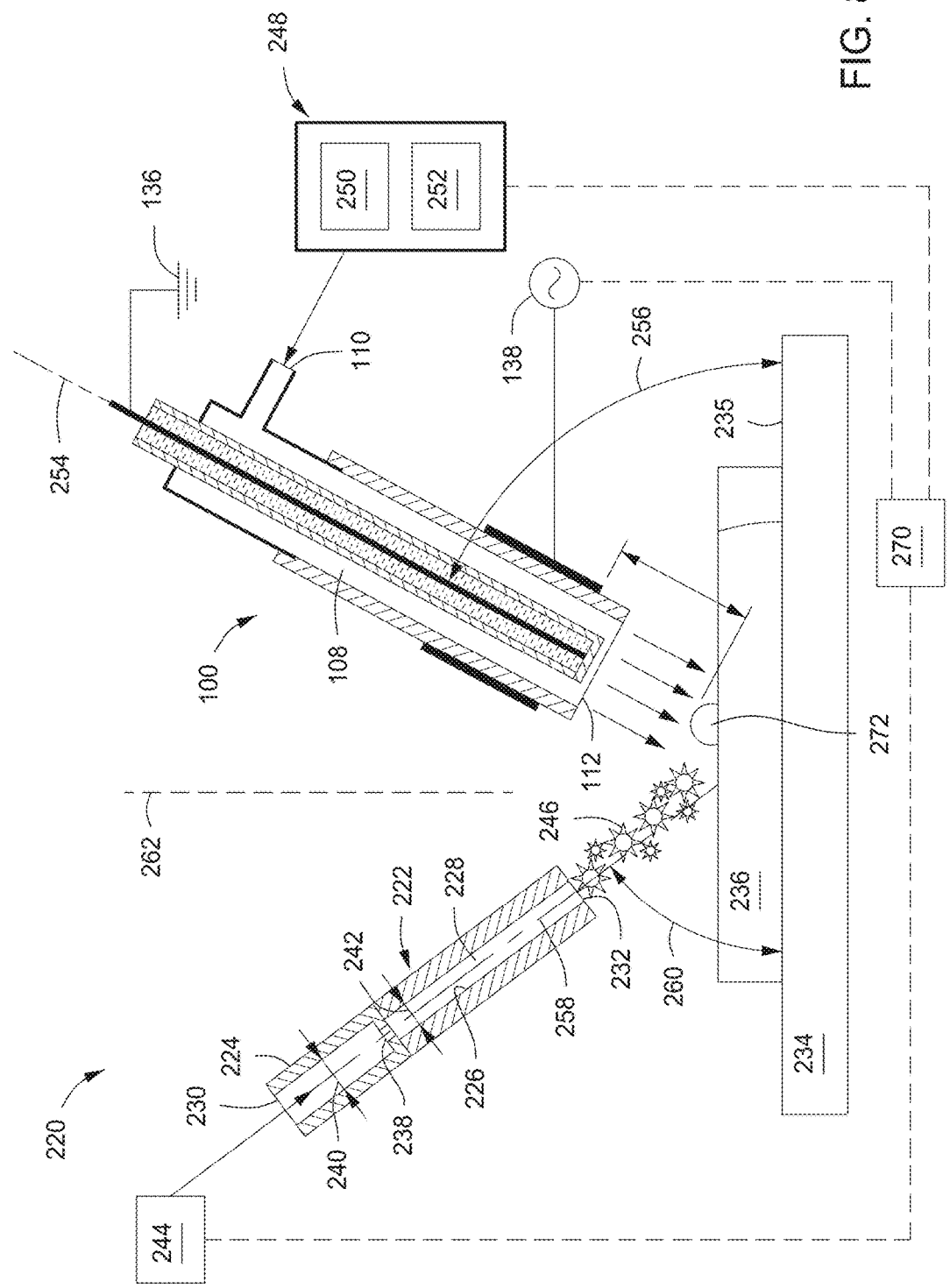

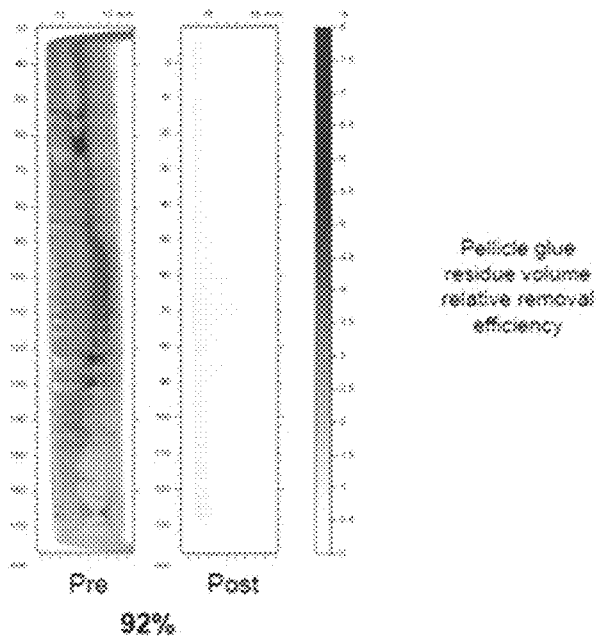
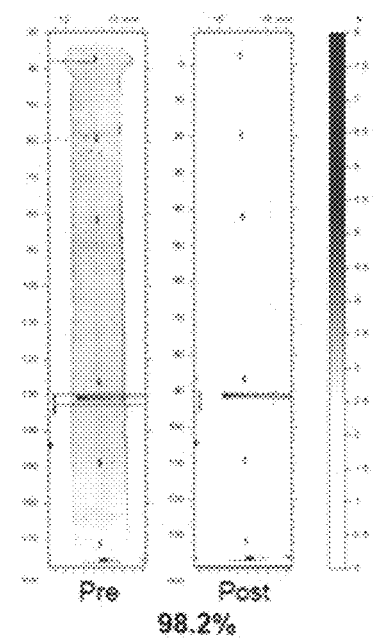
FIG. 19A    FIG. 19B
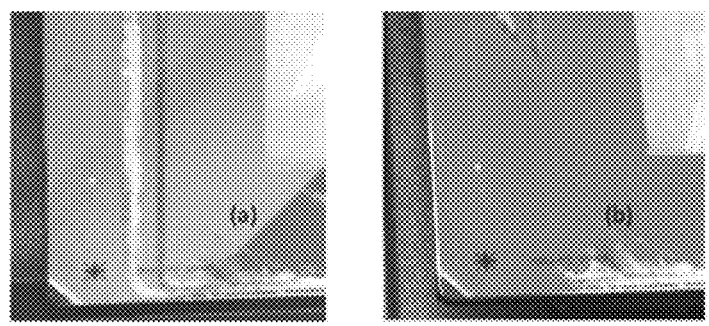
FIG. 20

CONTAMINATION REMOVAL APPARATUS AND METHOD

CROSS-REFERENCE TO RELATED APPLICATIONS

This application claims the benefit of U.S. Provisional Patent Application No. 61/649,012, titled Contamination Removal Apparatus and Method, filed May 18, 2012, the disclosure of which is hereby incorporated by reference in its entirety.

BACKGROUND OF THE INVENTION

This patent disclosure relates generally to apparatus and methods for cleaning contaminants from a substrate and, more particularly, to apparatus and methods for cleaning contaminants from a substrate using an ultra-clean, dry fluid stream.

Wafer cleanliness is recognized as a critical parameter in solid state electronic device manufacturing processes. And as the spatial scale of features on semiconductor devices decreases, the threshold size of particles that contribute to manufacturing defects also decreases, thereby placing higher demands on cleaning processes to remove the smaller particles. Indeed, particles as small as one micrometer, or smaller, can pose deleterious effects in current-day semiconductor fabrication. Further, the increased demands on cleaning method performance due to decreasing feature size is compounded by increasing wafer sizes because of the rise in the number of features on a wafer, posing more opportunities for cleanliness-related defects.

Some conventional approaches are known for removing particles and residue from substrates in the semiconductor fabrication industry and other industries with similar sensitivities to cleanliness. These approaches can be categorized as either physical cleaning techniques, such as brush scrubbing, dry argon ice cleaning, carbon dioxide ($CO_2$) aerosol techniques, or chemical cleaning techniques, such as plasma etching, or wet etching (with or without ultrasonic or megasonic agitation).

Physical aerosol jet cleaning has been demonstrated for dry removal of submicron contaminant particles. Aerosol particles can be formed in a gas stream by solidification of liquid droplets or the gaseous medium during rapid cooling. When the solid aerosol particle collides with a contaminant, the resulting momentum transfer generates a force on the contaminant that may overcome an adhesion force between the particle and a substrate, and thereby remove the particle or residue from the surface of the substrate. The $CO_2$ aerosol cleaning technique has been used for a variety of surface cleaning applications such as silicon (Si) wafers, photomasks, MEMS devices, packaging fabrication, imaging devices metal lift-off, ion implanted photoresist stripping, disk drives, flat panel displays, and post-dicing for three-dimensional stacked integrated circuits.

Plasma cleaning, on the other hand, is based on generating reactive species to eliminate organic contaminants by chemically converting the organic contaminants into volatile gaseous products. The reactive species used for plasma cleaning may include, for example, radicals or excited atoms created from oxygen, hydrogen, combinations thereof, or other similarly suited reactive species known to persons with ordinary skill in the art.

In the photomask industry, for example, some important issues are yield loss, cost, cycle time of mask technology, mask supply, and mask lifetime. There are numerous yield loss mechanisms associated with mask technology, including: excessive quantity of lithography patterning defects, hard defects (i.e., un-repairable defects soft defects (i.e., particle defects), particle defects after pellicle mounting, uniformity of the Critical Dimensions (CD), pellicle mounting error, and errors related to Optical Proximity Corrections (OPC). In some cases, the major process-related yield loss mechanisms may be hard and soft defects up to 56-67% of the total number of defects depending on the type of mask. Some reasons for performing mask maintenance may include soft defects (26%) and hard defects (10%). In other cases, the need for mask maintenance has been motivated by non-removable particles, ranging up to 34% of total maintenance and service calls. In summary, there exists a need to enhance the current cleaning technologies to enable removal of all possible particles from mask surfaces to meet increasingly stringent specifications.

Photomasks are utilized to repeatedly print fine features on wafers for high volume production. Mask lifetime may be reduced by growth of an organic and/or inorganic layer of defects (also called haze), electro-static discharge (ESD), non-removable particles, transmission loss, reflectivity loss, phase change, change in printed CD uniformity, and the like. These defects may be introduced from cleaning tools in addition to other process tools that may be used in the mask fabrication process or in wafer fabrication.

Conventional solvent cleaning techniques may result in sufficient degradation of the mask to limit mask life. Indeed, photomask life may be evaluated according to stringent specifications, and even a single parameter falling outside the specification may be sufficient to end a photomask's useful life. Foreign material and stains are known as soft defects on masks that require cleaning. Next generation lithography (NGL) masks, including Extreme Ultraviolet (EUV) and Nano-imprint lithography (NIL) masks, may be subject to life-limiting degradation issues caused by current cleaning technologies, and may also be affected by multiple types of contamination.

In optical mask technology, the active area may be protected from soft defects by adhering a pellicle to the mask. In general, three types of pellicle adhesive are available, including organosilcone, styrene-ethylene-butylene-styrene (SEBS), and methacrylate copolymer, for example. At times, the pellicle must be removed from the mask to perform repairs and perform cleaning to cure mask defects. Adhesive or glue residue "tracks" may remain following pellicle removal, and may require removal before a new pellicle can be applied to the mask. Removal of pellicle adhesive residues and subsequent reticle cleaning can be a costly and time-consuming operation. Not only are the wet chemicals costly, but safety and environmental issues may add further costs with respect to reticle cost-of-ownership.

Additionally, wet chemical processes have the potential to cause damage including critical dimension changes due to chemical attack, particularly for advanced phase-shifting reticles. The objective of reticle cleaning and pellicle reinstallation is to return the reticle to the wafer fabrication process unchanged with respect to its original performance. Ideally, a cleaning technique will, remove all pellicle adhesive residues, soft defects, organic and inorganic particles, with low cost and time requirements, and without damaging the mask.

For EUV mask technology the main sources of contamination are oxidation and the buildup of carbon contamination layers. Further, water may act as an oxidizer, and may etch surfaces such as silicon. In addition, carbon contamination (in film or particle form), may result from photon and/or electron enhanced dissociation of residual carbon-containing molecules in EUV exposure tools. In turn, the critical dimensions and reflectivity changes may influence the printability of the ask. Current solutions include reducing the contamination rate and/or cleaning the mask surfaces. A heavy metal capping layer that forms a stable oxide layer and prolongs the life of the mirror, albeit with a small reflectivity loss, may hinder cleaning EUV mask surfaces. In some cases, the capping layer may not prevent a build-up of carbon contamination, thereby making carbon build-up the main surface contamination process. Indeed, even under relatively good vacuum conditions, carbon contamination has been observed. Further, the high absorption of EUV radiation by carbon may compound the optical losses therethrough. Ideally, a cleaning technique is desired that will remove contaminants from EUV masks including soft defects, organic particles, and inorganic particles, without damaging the mask.

The semiconductor industry has developed cleaning and surface preparation techniques, including particle removal, residue removal, surface cleaning, and etching to promote production. However, the need for cleaning and surface preparation techniques extends beyond the semiconductor industry. Indeed, other fields such as biology, medicine (implants and equipment), aerospace, imaging, automobiles, pharmaceuticals, and the like, benefit from surface cleaning and preparation processes. In general, methods and apparatus for removing organic and inorganic defects including particle contaminants, chemical residues, pellicle adhesive residue, photoresist residue, carbon contamination, contamination adders from process tools, and the like, from substrates, as well as methods and apparatus for surface activation/conditioning may benefit a variety of industries such as lithography (optical and Extreme Ultra Violet (EUV) masks), semiconductors, compound semiconductors, MEMS, disk drives, imaging devices, LED/flat panel displays, photovoltaics, and other similar industries know to persons having ordinary skill in the art. In addition, aspects of the present disclosure may also be advantageously combined with other dry or wet cleaning techniques including, but not limited to, wet cleaning, laser shock cleaning, and frequency-assisted cleaning.

Some laboratories have investigated plasma cleaning processes using vacuum-based technology to remove surface contaminants from silicon substrates. Techniques including radio frequency (RF) remote plasma (also known as capacitive-coupled RF plasma) and electron cyclotron resonance (ECR) plasma may be used with carrier gases such as argon or helium, and gases such as oxygen or hydrogen, to generate excited atoms, molecules, or ions for etching processes. However, some of these conventional approaches may require expensive vacuum provisions, which may also contribute additional contaminants to the substrate as a result of pump down and venting, and which may damage the substrate due to accelerated ions or charged species directed onto the substrate. In addition, some of these conventional plasma approaches may not conveniently effect local or site-specific cleaning.

Conventional aerosol $CO_2$ cleaning is based on momentum transfer between the fast-moving snow aerosol generated through a nozzle and the surface contaminant. In situations where adhesion between the residue and surface is strong, such as organic contaminants, for example, large $CO_2$ snow with sufficient velocity to remove the residue may also cause damage to fine structures nearby. Further, the residue dislodged by the $CO_2$ snow may need to be carried away from the target area by a fluid flow and be filtered such that cleanliness of the chamber is preserved.

Convert tonal cleaning methods using atmospheric plasma sources may pose some disadvantages. First, the localized plasma source such as an atmospheric plasma may not remove inorganic contaminants. Second, there are few designs available for an atmospheric plasma etcher. One review article by Schütze et al, ("The Atmospheric-Pressure Plasma Jet: A Review and Comparison to Other Plasma Sources," IEEE Transactions on Plasma Science, Vol. 26, No. 6, (December 1998)), has explained in detail some designs of atmospheric pressure plasma. However, there are many modifications needed before it could be considered suitable for organic residue removal. For example, the literature has failed to suggest suitable materials to be used for the source chamber. Because of the harsh environment of the plasma, contamination may be generated from interaction of the plasma with the source chamber wall containing it. Anodized aluminum has been proposed, however, the oxide formed on aluminum in this process may not be smooth, could be non-uniform in thickness, may not exhibit sufficient purity with appropriate stoichiometry, and may not meet the exacting cleanliness requirements for a semiconductor fabrication environment.

A quartz tube with thickness of the order of millimeter has been proposed. Because the thermal conductivity of quartz is more than an order of magnitude less that of metals such as aluminum or stainless steel, reaching thermal steady state and maintaining desired temperature may be drawbacks of using quartz. In addition, quartz may not readily accommodate tailoring of the shape of the plasma container to adjust fluid characteristics of the gaseous jet issuing therefrom.

Species issuing from the source may not be collimated, and therefore, the jet may spread laterally. As a result, structures neighboring a surface intended to be cleaned could be exposed to the species emitting from the plasma and corrode them. Indeed, in some applications, primary features on the wafer or mask may not tolerate plasma exposure.

Further, conventional plasma source cleaning apparatus designs may not simultaneously accommodate $CO_2$ snow for physical removal of residues and provide vacuum pressure conditions sufficient to promote plasma operation.

SUMMARY

In one aspect, the disclosure describes a substrate dry cleaning apparatus. The substrate dry cleaning apparatus includes a first conduit defining a first flow channel therein, the first conduit further defining a first exit aperture in fluid communication with the first flow channel; a first electrode disposed in a vessel; a second electrode facing the first electrode, the first flow channel disposed between the first electrode and the second electrode; and a metal having a low atmospheric melting temperature filling a gap between the first electrode and the vessel.

In another aspect, the disclosure describes a substrate dry cleaning system. The substrate dry cleaning system includes a substrate support and a reactive species generator. The reactive species generator includes a first conduit defining a first flow channel that extends to an outlet of the first conduit, the outlet of the first conduit facing the substrate support; a first electrode; a second electrode facing the first electrode, the first flow channel disposed between the first electrode and the second electrode; a first inert wall disposed between the first electrode and the first flow channel; and a second inert wall disposed between the second electrode and the first flow channel.

In yet another aspect, the disclosure describes a method of cleaning a substrate. The method of cleaning the substrate includes delivering a first fluid to a flowpath of a reactive species generator, the first fluid containing at least one reactive precursor; creating an electric field through a first inert wall of the reactive species generator, the flowpath of the reactive species generator, and a second inert wall of the reactive species generator by applying an alternating electric potential across a pair of electrodes, the first inert wall and the second inert wall at least partially defining the flowpath of the reactive species genera or, the first inert wall facing the second inert wall; dissociating the a least one reactive precursor into at least one reactive species in response to the electric field; and impinging the at least one reactive species against a substrate.

BRIEF DESCRIPTION OF THE DRAWINGS

FIG. 7A presents a graph of the gasification rate of hydrogen plasma at a constant 95 Watt nominal power input versus a variation of hydrogen ($H_2$) flow rate.

FIG. 7B presents a graph of the gasification rate of hydrogen plasma at a constant 95 Watt nominal power input versus a variation in helium (He) carrier gas flow rate.

FIG. 8 is a schematic view of a substrate dry cleaning system, according to an aspect of the disclosure

FIGS. 18A and 18B show scans of a wafer before and after hydrogen plasma exposure, respectively, depicting total clustered defects.

FIGS. 19A and 19B present optical profilometer measurements before and after $CO_2$ cleaning of pellicle adhesive residue from optical mask blanks, respectively.

FIGS. 20A and 20B present images of a substrate before and after SEBS adhesive track removal, respectively.

DETAILED DESCRIPTION

Figure 1:
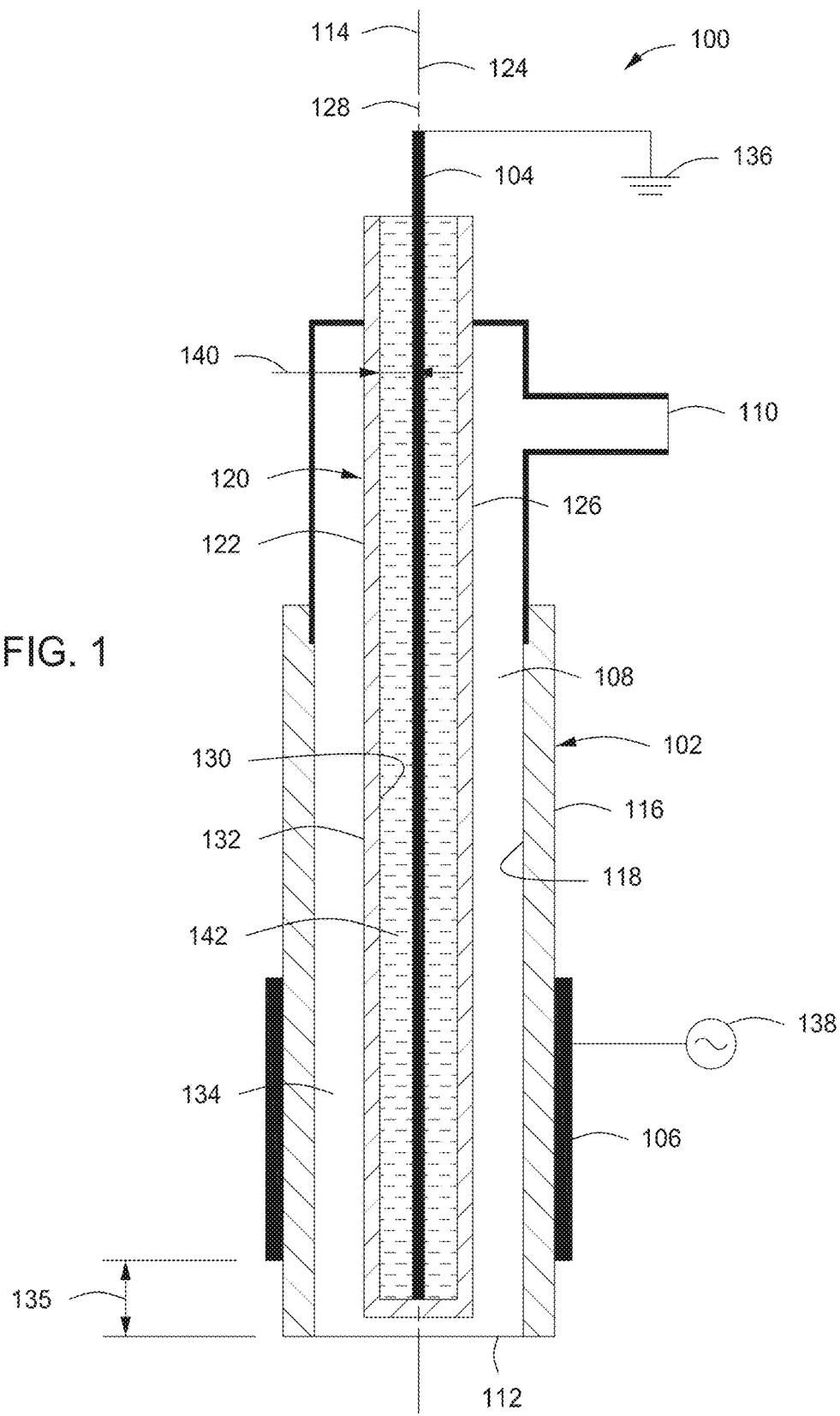
FIG. 1 is a schematic view of a reactive species generator, according to one aspect of the disclosure.

Aspects of the disclosure address many of the aforementioned cleaning and surface preparation challenges without the limitations of previous methods. The disclosed dry cleaning approach includes an integrated cleaning source that provides monatomic oxygen, monatomic hydrogen, other reactive species generated in a plasma, or combinations thereof, for quick chemical gasification removal and/or generation cryogenic $CO_2$ particles from liquid or gaseous aerosols for physical removal of contaminants. One advantage of such a tool is its ability to remove both organic and inorganic residues from targeted localized areas of a substrate. Unlike solution-based cleaning approaches, aspects of the disclosure enable residue and contaminant cleaning from select local areas of a substrate surface, without exposing the entire substrate to potentially corrosive etchant species. Other aspects of the disclosure enable improved plasma stability and improved substrate temperature control during reactive cleaning processes.

The disclosed reactive species source may be advantageously operative in an atmospheric pressure environment, thereby eliminating the need for expensive vacuum systems, avoiding contamination adders that may be generated by pumping and venting, thus increasing tool availability, and providing localized cleaning without unnecessarily subjecting other areas of the substrate to reactant exposure.

Aspects of the disclosure may be applied to various processes, including, but not limited to: removal of all types of contamination, including pellicle adhesive residue, particle contaminants, chemical residue, carbon contamination, photoresist residue, polymer residue after wet etch, or the like, from optical masks; removal of defects as well as carbon contamination from EUV masks; removal of photoresists, sacrificial layers, sidewall polymers, defects, or the like, from MEMS devices; post dicing debris removal from 3-D stacked IC integration flows; residual metal lift off and photoresist removal for compound semiconductors; removal of veils and contamination defects from MR heads on hard disk drives; contamination and Post-CMP residue removal for semiconductors; and removal of contamination form LED, Flat Panel Displays, solar cells, and the like.

Aspects of the disclosure advantageously provide systems and methods for cleaning substrates having organic and/or inorganic contamination. In one aspect, the disclosed apparatus includes an ultra-clean, non-particulating, plasma source for generation of reactive gas species employed for contamination mitigation. The ultra-clean plasma chemically converts or disassociates a gas supply stream into a locally intensive jet of reactive fluid including species such as atomic hydrogen, atomic oxygen, combinations thereof, or other reactive species known to persons of ordinary skill, to gasify contamination residues. The generation of reactive species is initiated at a relative distance from the substrate being cleaned to prevent any plasma from coming in contact with the surface, thus mitigating damage from direct plasma contact and high energy electrons.

In other aspects of the disclosure, the ultra-clean plasma source may be advantageously combined with other cleaning apparatus, techniques, and processes, especially a physical removal process such as ultra-clean $CO_2$ snow momentum transfer cleaning. While both technologies can be used to clean organic and inorganic contaminants, $CO_2$ snow cleaning alone preferentially removes inorganic defects, while the reactive species preferentially remove organic defects. The combined apparatus provides a benign dry cleaning solution for removal of organic and inorganic residues without substrate surface degradation or change. An advantage of the disclosed apparatus and methods is the ability to produce either a local removal of organic and inorganic contamination as well as the ability to process an entire substrate by movement of the local process relative to the target substrate. Unlike solution-based cleaning and conventional low-pressure plasma clean, the residues can be removed through local site-specific processing, without exposing an entire active area to corrosive etchants.

The disclosed integrated dry cleaning apparatus may provide reactive species such as monatomic oxygen, monatomic hydrogen, combinations thereof, or other reactive species formed in a plasma for quick chemical gasification of contaminants, alone or in combination with generation of cryogenic $CO_2$ particles for physical removal of contaminants. One advantage the disclosed technology is its capability to remove both organic and inorganic residues while limiting substrate exposure to a confined or targeted local area. Unlike solution-based cleaning, residues and other contaminants can be removed locally, without exposing an entire substrate with active area to potentially corrosive etchants.

FIG. 1 is a schematic view of a reactive species generator 100, according to one aspect of the disclosure. The reactive species generator 100 includes a first conduit 102, a first electrode 104, and a second electrode 106. The first conduit 102 defines a first flow channel 108 extending between an inlet 110 and an outlet 112 of the first conduit 102. The first conduit 102 may have an axisymmetric shape including, for example, a cylindrical wall; a rectilinear shape including, for example, planar walls facing one another; combinations thereof; or other conduit shapes known to persons having ordinary skill in the art. A cylindrical wall of the first conduit 102 could have a cross section normal to a longitudinal axis 114 of the first conduit 102 having a circular shape, a polygonal shape, a rectangular shape, an ellipsoidal shape, combinations thereof, or other conduit cross sectional shape known to persons having ordinary skill in the art.

The first electrode 104 and the second electrode 106 are configured to generate a plasma from a fluid in the first flow channel 108 between the first electrode 104 and the second electrode 106 when a sufficient Radio Frequency (RF) electrical potential is applied across the two electrodes 104, 106. Unless specified otherwise, the term "fluid" may include either gases or liquids. According to one aspect of the disclosure, the first electrode 104 and the second electrode 106 have an axisymmetric arrangement, with the second electrode 106 disposed around the first electrode 104. In another aspect of the disclosure, the first electrode 104 and the second electrode 106 have a non-axisymmetric arrangement, with second electrode 106 disposed around the first electrode 104. In yet another aspect of the disclosure, the first electrode 104 and the second electrode 106 each have a planar shape and face one another in a rectilinear arrangement.

The second electrode 106 may be an electrically conductive foil or coating disposed on an outer surface 116 of the first conduit 102, or disposed on an inner surface 118 of the first conduit 102. The first electrode 104 may be an electrically conductive rod or cylinder having a circular cross section, a polygonal cross section, an ellipsoidal cross section, or other cross section known to persons having ordinary skill in the art.

The reactive species generator 100 may also include an internal member 120 disposed within the first conduit 102, where the internal member 120 further defines the first flow channel 108. The internal member 120 may include a cylindrical outer surface 122 having a circular cross section, a polygonal cross section, an ellipsoidal cross section, combinations thereof, or other cross sectional shape known to persons having ordinary skill in the art. Further, the internal member 120 may have a solid cross section or a hollow cross section. In one aspect of the disclosure, the internal member 120 has a hollow cross section defined by an inner surface 130 of a generalized cylindrical wall 126. In another aspect of the disclosure, the generalized cylindrical wall 126 of the internal member 120 is a circular cylindrical wall.

The first electrode 104 may be disposed within the internal member 120, and the first electrode 104 may or may not contact the internal member 120. Alternatively, the first electrode 104 may be an electrically conductive foil or coating disposed on the inner surface 130 or an outer surface 132 of the internal member 120. A coating on the internal member 120 that serves as the second electrode may include nickel, silver, or other material with similar electrical properties known to persons having ordinary skill in the art A longitudinal axis 124 of the internal member 120 may or may not be coaxial with the longitudinal axis 114 of the first conduit 102. Further a longitudinal axis 128 of the first electrode 104 may or may not be coaxial with the longitudinal axis 114 of the first conduit 102.

There are several methods for generating a plasma within the reactive species generator 100. According to an aspect of the disclosure, the first electrode 104 may be an electrically conductive anode in electrical communication with a ground 136, and the second electrode 106 may be a cathode coupled to an RF electrical source 138. When reactive gases, and optionally carrying gases, flow between the first electrode 104 and the second electrode 106 and an RF electrical potential is applied to the second electrode 106 via the electrical source 138, plasma species may be generated in the plasma zone 131 between the first electrode 101 and the second electrode 106.

According to an aspect of the disclosure, the electrical source 138 is a capacitive-coupled source that provides a radio frequency (RF) ranging from about 10 MHz to about 100 MHz, or a capacitive-coupled source that provides a microwave frequency ranging from about 2 GHz to about 4 GHz. According to another aspect of the disclosure with another configuration, the electrical source provides an alternating electrical potential at a frequency of about 13.6 MHz. According to yet another aspect of the disclosure with yet another configuration, the electrical source provides an alternating electrical potential at a frequency of about 2.4 GHz. The power input from the electrical source 138 may range from about 20 Watts to about 200 Watts, depending on the degree of ionization or ion temperature desired at the substrate.

The reactive species generator 100 may advantageously incorporate materials that are not chemically reactive with the plasma species, that have high temperature resistance, and that have high purity. In general, material selection for the parts of the reactive species generator 100 that are in contact with the plasma, such as the inner surface. 118 of the first conduit 102 and the outer surface 132 of the internal member 120, are selected to achieve an ultra-clean plasma source according to aspects of the disclosure. For example, in the case of an oxygen plasma source, the apparatus materials that interact with the plasma should be non-reactive or inert to the oxygen plasma species and may include materials such as quart or sapphire, or other materials with similar oxygen reaction properties known to persons having ordinary skill in the art.

According to an aspect of the disclosure, a portion of the first flow channel 108 may define the plasma zone 134, where the first conduit 102 includes an outer quartz tube and the internal member 120 includes an inner quartz tube. According to another aspect of the disclosure, a downstream edge of the second electrode is separated from the outlet 112 of the first conduit 102 by an axial distance 135, thereby promoting neutralization of charged reactive species before the reactive species exit the reactive species generator 100.

Minimizing a radial air gap 140 between the first electrode 104 and the internal surface 130 of the internal member 120 may help to prevent breakdown of an electric field within the gap 140 region. Indeed, an air gap 140 between the first electrode 104 and the inner surface 130 of the internal member 120 may cause arcing across the gap, and therefore may cause instability of the plasma during operation, as well as difficulty with initial ignition of the plasma. Further, generation of a plasma adjacent either the first electrode 104 or the second electrode 106 outside the desired internal plasma zone 134, may erode a surface of the electrode, thereby creating particles and material from the electrode that could contaminate the substrate.

However, a material of the first electrode 104 may have a disproportionately higher thermal expansion coefficient than a material of the internal member 120, thereby posing a risk of mechanical damage to the internal member 120 if the radial air gap 140 therebetween is too small and the first electrode 104 exerts a sufficient radial force against the internal member 120 upon heating. Indeed, high plasma operation temperatures may approach 800° F. (700 K) and could produce damaging differential thermal expansion between the first electrode 104 and the internal member 120 if the gap 140 is too small.

To address these competing effects between plasma-generating performance and differential thermal expansion, the first electrode 104 may be coated with non-conductive and high purity plasma-compatible inert coating. Alternatively, the first electrode 104 may be disposed within an electrically insulating internal member 120 such as a quartz sleeve with a gap therebetween filled, for example, with a low melting point metal 142 or metal eutectic. Another option, discussed above, may include forming the first electrode 104 by coating the internal member 120 with a conductive film such as nickel or silver, thereby eliminating the gap 140 and reducing the risk that the first electrode 104 could exert damaging radial force against the internal member 120 through differential thermal expansion.

The low melting point metal 142 disposed within a larger gap may prevent damaging stress to the internal member 120 while simultaneously preventing arcing between the first electrode 104 and the internal member 120. In one aspect of the disclosure, the low melting point metal 142 may assume a solid phase at ambient temperature and pressure. However, as the temperature of the metal filler 142 increases during plasma operation, the solid may melt to liquid and thereby relieve stress between the first electrode 104 and the internal member 120 by providing fluid compliance therebetween.

Some examples of low melting point metal alloys that can be used as a filler between the first electrode 104 and the internal member 120 include indium, lead, bismuth, or combinations thereof. In one aspect of the disclosure, the low melting point metal 142 is a lead-bismuth eutectic (LBE) including about 44.5 weight percent lead and about 55.5 weight percent bismuth, having a melting point of about 255° F. (397 K). The saturation vapor pressure of LBE at a temperature of 800° F. (700 K) is less than about 7-10 Pa. Using low melting point metals with very low vapor pressure allows for thermo-mechanical stress compensation while avoiding metal contamination to the surface being cleaned.

Figure 23:
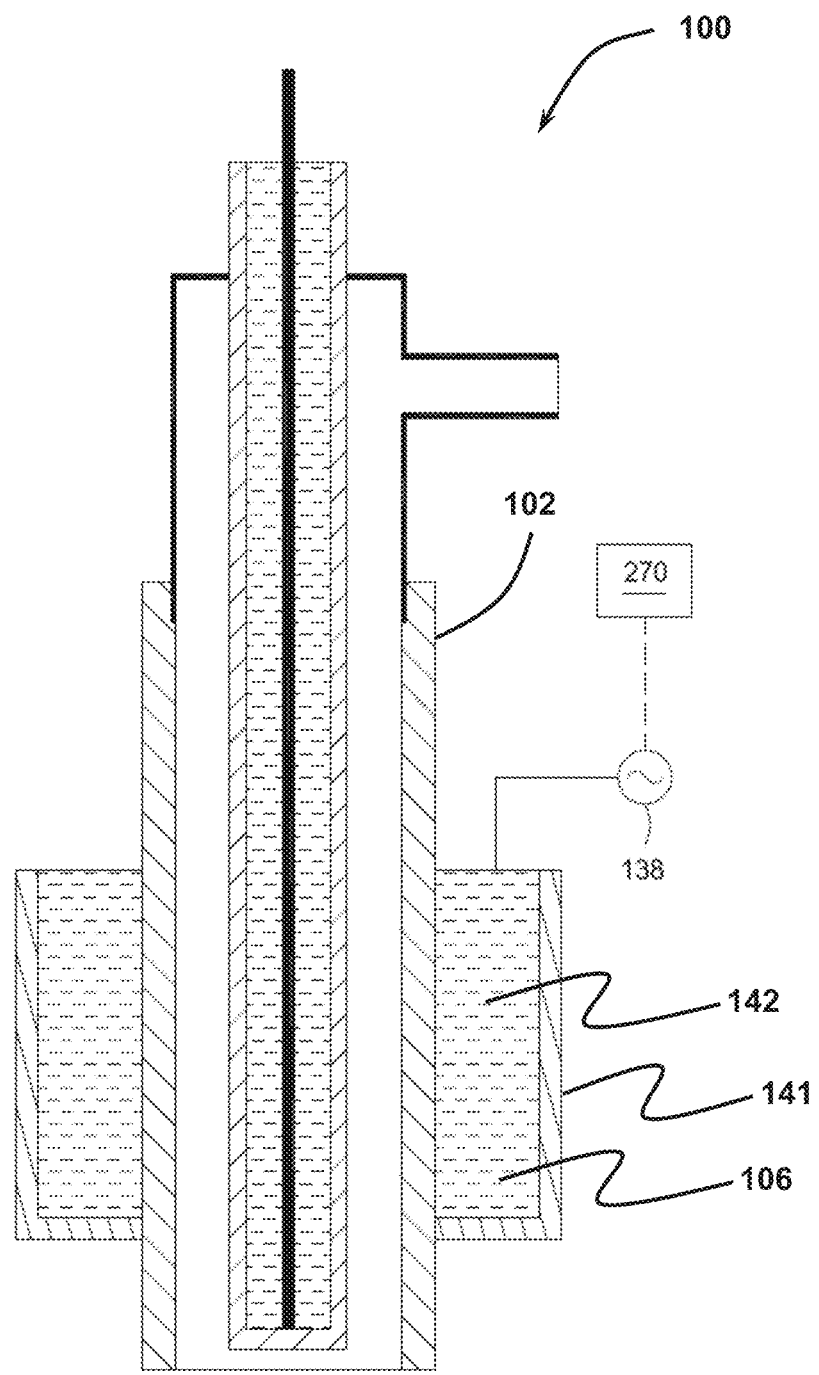
FIG. 23 is a schematic view of a reactive species generator, according to an aspect of the disclosure.

As shown in FIG. 23, a basin or vessel 141 may surround the first conduit 102 and contain a low melting point metal 142 therein. According to one aspect of the disclosure, the second electrode 106 is disposed within the basin or vessel 141 and the low melting point metal 142 may a gap between the second electrode 106 and the basin or vessel 141. According to another aspect of the disclosure the low melting point metal 142 disposed within the basin or vessel 141 may be in electrical communication with the RF electrical source 138 and function itself as the second electrode 106.

Selection of an appropriate material to be used for the second electrode 106, or cathode as shown in the FIG. 1, is also an important consideration. A material for the second electrode 106 will preferably have high electrical conductivity and low electrical resistivity, such as, for example, copper, aluminum, and tungsten. However, the potential for high temperature of the first conduit 102, and therefore, the second electrode 106, may make alternative materials preferable according to some aspects of the disclosure. The second electrode 106 may reach temperatures up to 932° F. (500° C.), where oxidation of the second electrode 106 material should be considered because oxidation may shorten the useful life of the second electrode 106 and/or create undesirable contaminants that may contaminate the substrate being cleaned. Therefore, alternative electrode materials with high temperature resistance may be preferable, such as, for example, platinum or platinum-Rhodium foils because of their good electrical conductivity and resistance to oxidation at plasma temperatures.

The rate of gasifying organic contaminants using a fluid stream from the reactive species generator 100 may depend on the composition of the fluid; intensive properties of the fluid, for example, but not limited to, temperature or viscosity; a velocity profile of the fluid stream leaving the reactive species generator; combinations thereof, or other fluid or flow properties know to persons having ordinary skill in the art. A fluid flow of gas or liquid, entering the inlet 110 of the first conduit 102 may exit the reactive species generator 100 with a radial velocity profile concentrated in an annular ring corresponding to the annular flow area between the internal member 120 and the first conduit 102, which may be advantageous for some cleaning applications.

Alternatively an exit nozzle may be added to the outlet 112 of the reactive species generator 100 to modify the velocity profile of a fluid flow exiting the reactive species generator 100. FIGS. 2-6 illustrate non-limiting examples of end caps having exit nozzles that may be applied to the reactive species generator 100 to modify the velocity, profile of a fluid flow exiting the reactive species generator 100, and thereby accelerate the rate of reaction between a fluid jet containing the reactive species and a contaminant thus hastening gasification of the contaminant.

Figure 2A:
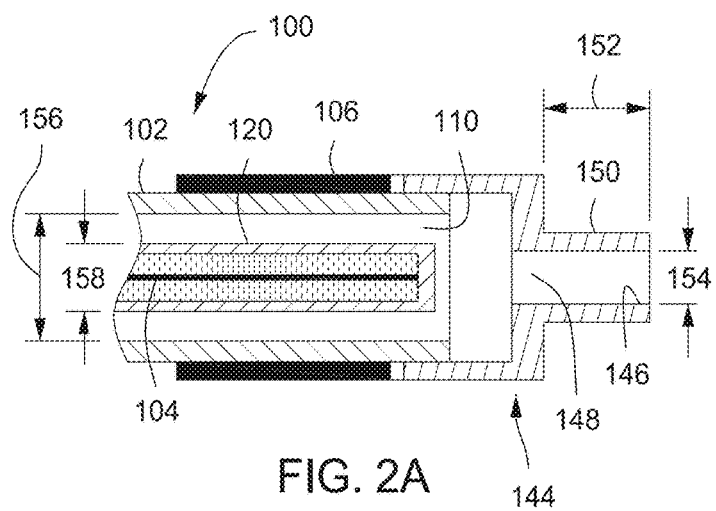
FIG. 2A is a partial cross sectional view of a reactive species generator having an end cap, according to an aspect of the disclosure.
Figure 2B:
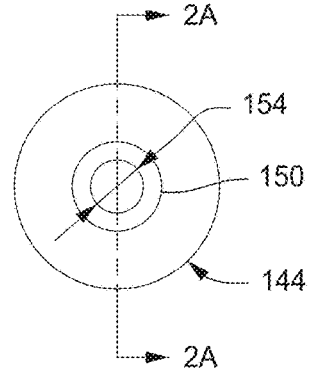
FIG. 2B is a bottom view of the reactive species generator in FIG. 2A.

Referring now to FIGS. 2A and 2B, it will be appreciated that FIG. 2A is a partial cross sectional view of a reactive species generator having an end cap 144, according to an aspect of the disclosure and FIG. 2B is a bottom view of the reactive species generator in FIG. 2A. An internal surface 146 of the end cap 144 defines a flow passage 148 therethrough. The flow passage 148 is in fluid communication with the outlet 112 of the reactive species generator 100.

The end cap 144 includes an extension tube 150 having a length 152 and an internal dimension 154. The end cap 144 receives fluid exiting the reactive species generator 100, and may modify the inlet velocity profile into a more collimated fluid jet. A collimated fluid jet formed by the end cap 144 may provide advantages for cleaning operations over a localized region of a substrate smaller than an inner dimension 156 of the first conduit 102.

According to an aspect of the disclosure, the length 152 is greater than the internal dimension 154. According to another aspect of the disclosure, the internal dimension 154 is an internal diameter. According to yet another aspect of the disclosure, the internal dimension 154 is smaller than an inner dimension 156 of the first conduit 102. Further, the internal dimension 154 may be smaller or larger than an external dimension 158 of the internal member 120 of the reactive species generator 100.

Figure 3A:
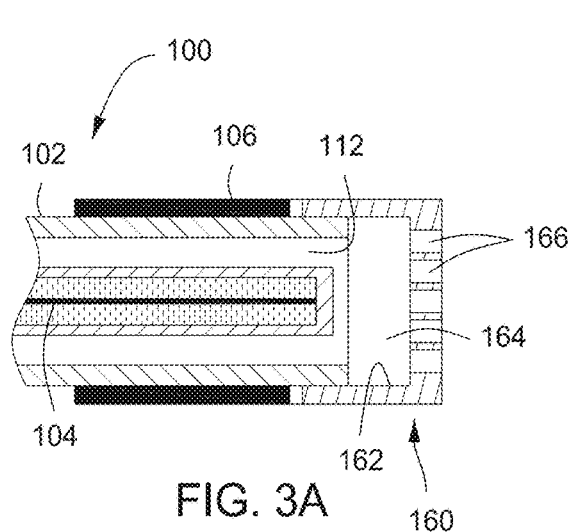
FIG. 3A is a partial cross sectional view of a reactive species generator having an end cap, according to an aspect of the disclosure.
Figure 3B:
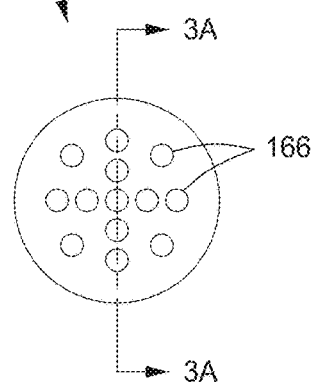
FIG. 3B is a bottom view of the reactive species generator in FIG. 3A.

Referring now to FIGS. 3A and 3B, it will be appreciated that FIG. 3A is a partial cross sectional view of a reactive species generator having an end cap 160, according to an aspect of the disclosure; and FIG. 3B is a bottom view of the reactive species generator in FIG. 3A. An internal surface 162 of the end cap 160 defines a flow passage 164 therethrough. The flow passage 164 is in fluid communication with the outlet 112 of the reactive species generator 100.

The end cap 160 further defines a plurality of exit orifices 166 extending through the end cap 160, which may be referred to as a "showerhead" design. The end cap 144 receives fluid exiting the reactive species generator 100, and may modify the inlet radial velocity profile into a plurality of smaller fluid jets issuing from the plurality of exit orifices 166. The plurality of smaller fluid jets formed by the end cap 160 may advantageously improve uniformity of the flow exiting the reactive species generator 100. The plurality of exit orifices 166 may be distributed in radial arrays, circumferential arrays, rectilinear arrays, combinations thereof, or any other arrangement known to persons having ordinary skill in the art.

Figures 4A, 4B:
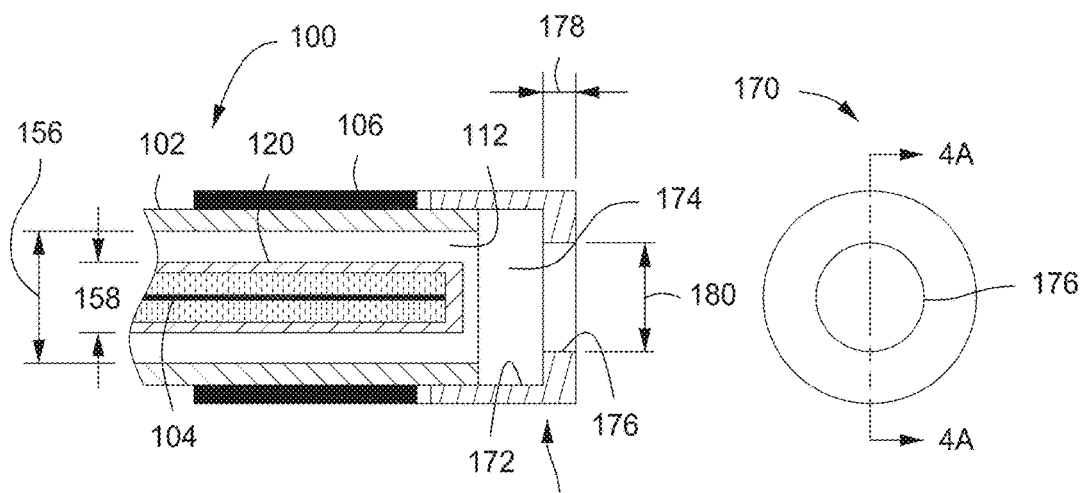
FIG. 4A is a partial cross sectional view of a reactive species generator having and end cap, according to an aspect of the disclosure.
FIG. 4B is a bottom view of the reactive species generator in FIG. 4A.

Referring now to FIGS. 4A and 4B, it will be appreciated that FIG. 4A is a partial cross sectional view of a reactive species generator having an end cap 170, according to an aspect of the disclosure; and FIG. 4B is a bottom view of the reactive species generator in FIG. 4A. An internal surface 172 of the end cap 170 defines a flow passage 174 therethrough. The flow passage 174 is in fluid communication with the outlet 112 of the reactive species generator 100.

The internal surface 172 further defines an exit orifice 176 through the end cap 170. The end cap 170 receives fluid exiting the reactive species generator 100, and may modify the inlet velocity profile into a more collimated fluid jet. A fluid jet formed by the end cap 170 may provide advantages for cleaning operations over a localized region of a substrate smaller than the inner dimension 156 of the first conduit 102.

According to an aspect of the disclosure, an axial length 178 of the exit orifice 176 is less than a transverse dimension 180 of the exit orifice 176. According to another aspect of the disclosure, the transverse dimension 180 is an internal diameter. According to yet another aspect of the disclosure, the transverse dimension 180 is smaller than an inner dimension 156 of the first conduit 102. Further, the transverse dimension 180 may be smaller or larger than an external dimension 158 of the internal member 120 of the reactive species generator 100.

Figures 5A, 5B:
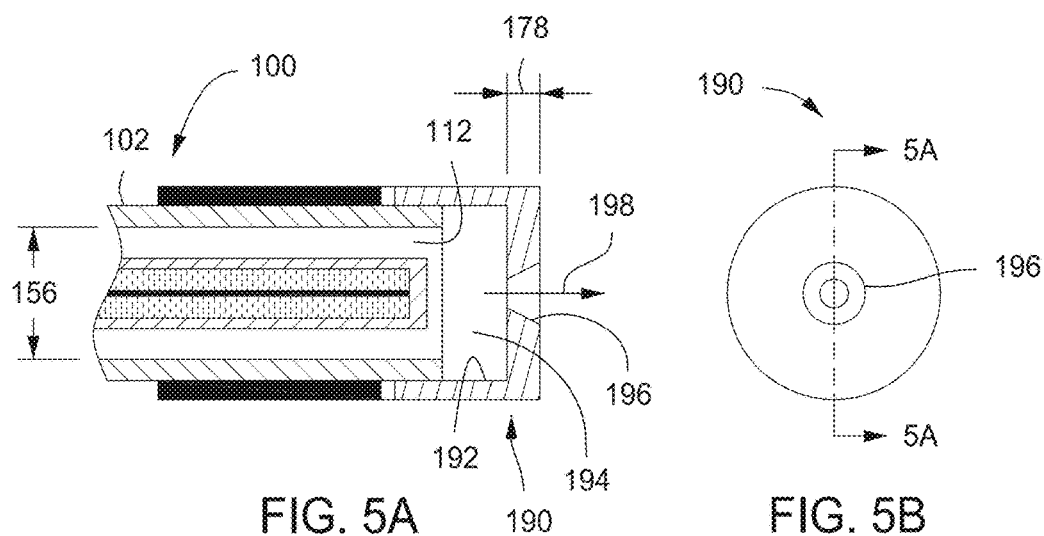
FIG. 5A is a partial cross sectional view of a reactive species generator having an end cap, according to an aspect of the disclosure.
FIG. 5B is a bottom view of the reactive species generator in FIG. 5A.

Referring now to FIGS. 5A and 5B, it will be appreciated that FIG. 5A is a partial cross sectional view of a reactive species generator 100 having an end cap 190, according to an aspect of the disclosure; and FIG. 5B is a bottom view of the reactive species generator 100 in FIG. 5A. An internal surface 192 of the end cap 190 defines a flow passage 194 therethrough. The flow passage 194 is in fluid communication with the outlet 112 of the reactive species generator 100.

The internal surface 192 further defines an exit orifice 196 through the end cap 190. A flow area of the exit orifice 196 diverges or increases along a direction of flow 198 exiting the end cap 190. The end cap 190 receives fluid exiting the reactive species generator 100, and may modify the inlet velocity profile into a diverging or diffusing fluid jet. A fluid jet formed by the end cap 190 may provide advantages for cleaning operations over a localized region of a substrate smaller than the inner dimension 156 of the first conduit 102.

Figures 6A, 6B:
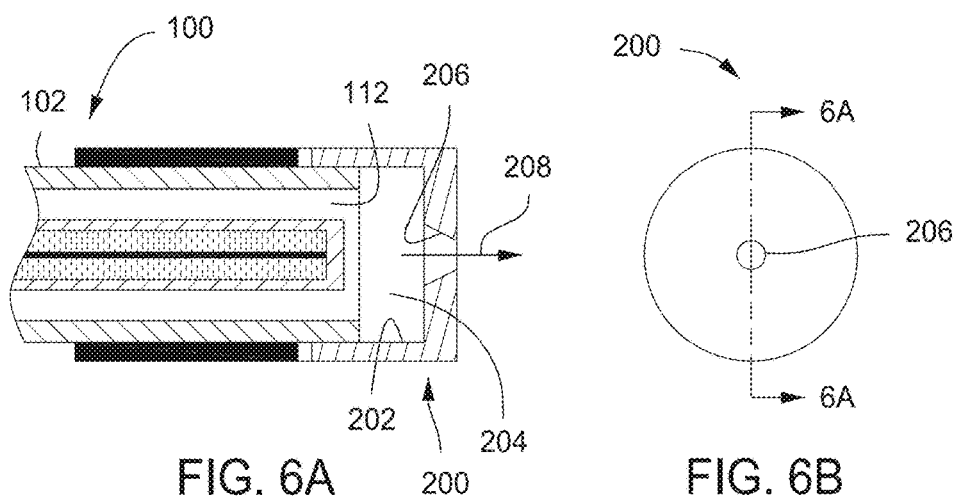
FIG. 6A is a partial cross sectional view of a reactive species generator having an end cap, according to an aspect of the disclosure.
FIG. 6B is a bottom view of the reactive species generator in FIG. 6A.

Referring now to FIGS. 6A and 6B, it will be appreciated that FIG. 6A is a partial cross sectional view of a reactive species generator 100 having an end cap 200, according to an aspect of the disclosure; and FIG. 6B is a bottom view of the reactive species generator 100 in FIG. 6A. An internal surface 202 of the end cap 200 defines a flow passage 204 therethrough. The passage 204 is in fluid communication with the outlet 112 of the reactive species generator 100.

The internal surface 202 further defines an exit orifice 206 through the end cap 200. A flow area of the exit orifice 206 converges or decreases along a direction of flow 208 exiting the end cap 200. The end cap 200 receives fluid exiting the reactive species generator 100, and may modify the inlet velocity profile into a converging or accelerating fluid jet. A fluid jet formed by the end cap 200 may provide advantages for cleaning operations over a localized region of a substrate smaller than the inner dimension 156 of the first conduit 102.

It will be appreciated that any of the end caps 144, 160, 170, 190, 200 may be made from a material that is inert or does no appreciably react with either monatomic oxygen or monatomic hydrogen, such as, for example, quartz or sapphire. Further, the end caps may be distinct from the first conduit 102 or integral with the first conduit 102. Moreover, it will be appreciated that more than one of the exit nozzle geometries illustrated in FIGS. 2-6, and described above, may be advantageously combined in a single end cap.

The reactive species generator 100 may be coupled to a high pressure gas source through a regulator and optionally to a compressed helium or argon source to supply gases to the first flow path 108. The gas delivery may include one or more reactive gases and one or more carrying gases. Further, the gas delivery may include a manifold for combining separate gas sources or may utilize premixed gases.

The reactive species generator 100 may use a carrying gas in combination with the reactive gas to control a concentration of the reactive gas species in a fluid jet. The ease of ignition and stability of a plasma may depend, for example, on the partial pressure of reactive species and carrier gas, as well as the shape of electrodes, and the distance between anode and cathode. The flow rates, in addition, may control the ion temperature within the plasma, which may ultimately affect rates of neutralization of charged reactive species and recombination of reactive species into less reactive species downstream of the plasma.

The reactive species generator 100 may include gas flow controllers and a means for mixing gases prior to introduction into the plasma zone. This facilitates accurate control of the reactive species concentration, and the flow rate of the gas mixture. By controlling the concentration of reactive as the majority of molecular species are dissociated or advanced to an excited state, thereby becoming more reactive. For example, diatomic oxygen may be dissociated into monatomic oxygen. Likewise, diatomic hydrogen may be dissociated into monatomic hydrogen. In addition, flowrate control may promote economic usage of carrying gas (for example, helium, argon, or the like) as well as temperature control of the resulting reactive species. Temperature control of the reactive species can be critical depending on the target substrate materials. Delivering a low flow rate to the plasma zone 134 may help to prevent physical damage of the substrate by providing a longer time of flight between the plasma zone and the substrate, thereby promoting the neutralization of charged reactive species, in addition to decreasing a velocity of the charged species against the substrate. By utilizing low flow fluid rates into the plasma zone both undesirable surface etching and charging may be mitigated.

Referring now to FIGS. 7A and 7B, it will be appreciated that FIG. 7A presents a graph of the gasification rate of a cyanoacrylate adhesive film (3 to 4 microns thick) on silicon by monatomic hydrogen generated in a plasma at a constant 95 Watt nominal power input versus a variation of input diatomic hydrogen flow rate; and FIG. 7B presents a graph of the gasification rate of a cyanoacrylate adhesive film (3 to 4 microns thick) on silicon by monatomic hydrogen generated in a plasma at a constant 95 Watt nominal power input versus a variation in helium carrier gas flow rate.

The RF plasma power was set within the range described previously to about 95 W of input power. At this power level and with optimization of the impedance match, about 89 W of power is coupled directly to plasma generation. For a constant helium flow rate of about 7.5 standard liter per minute (slm), the gasification rate of the film increases with input hydrogen flow rate almost linearly up to 1 situ (see FIG. 7A). By keeping the flow rate of hydrogen constant (for example equal to 1.0 slm), the maximum film gasification rate of approximately 100 nm/s is achieved by modification of the carrying gas or gasses, in this example helium (see FIG. 7B).

Figure 9:
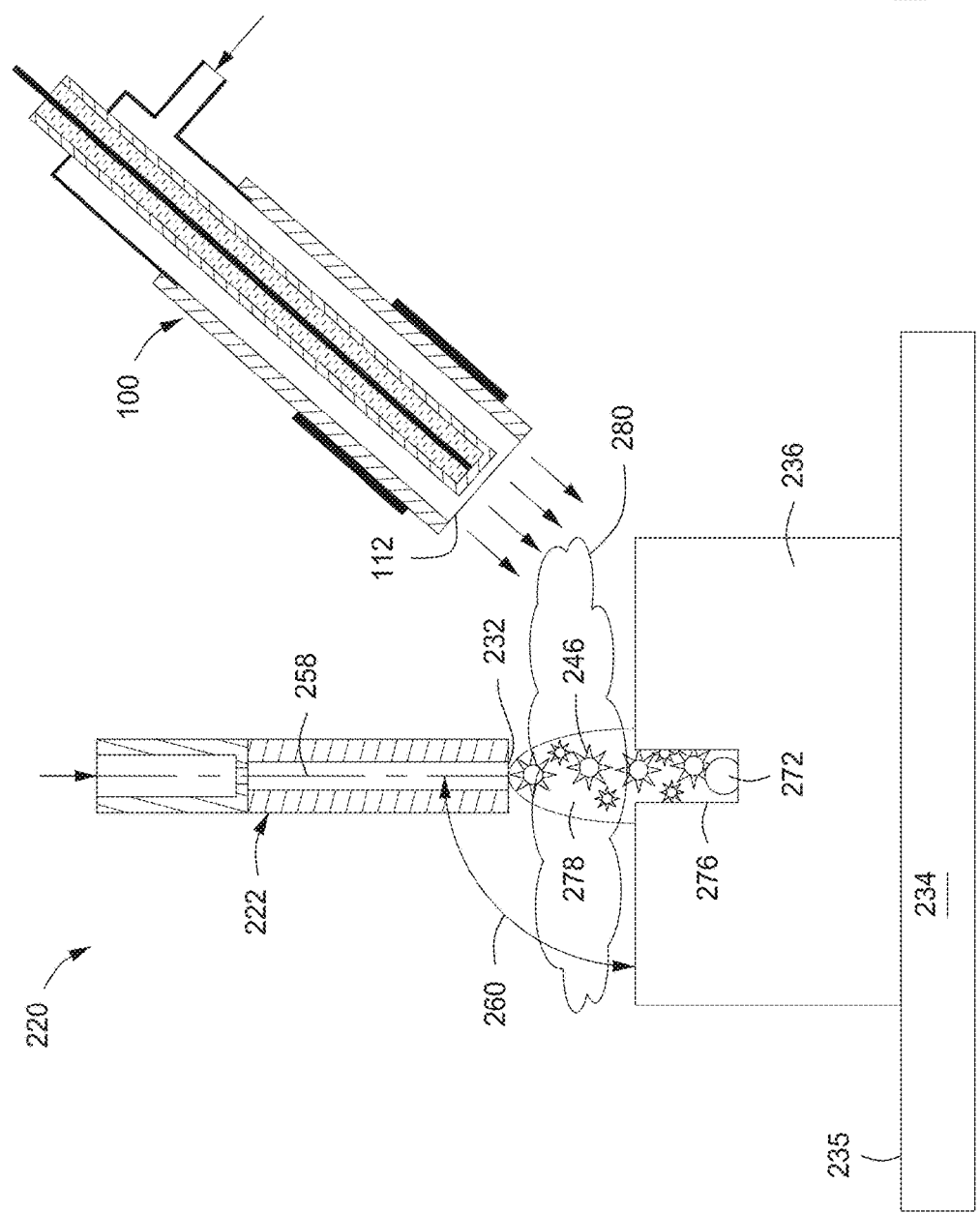
FIG. 9 is a schematic view of a substrate dry cleaning system, according to another aspect of the disclosure.
Figure 10:
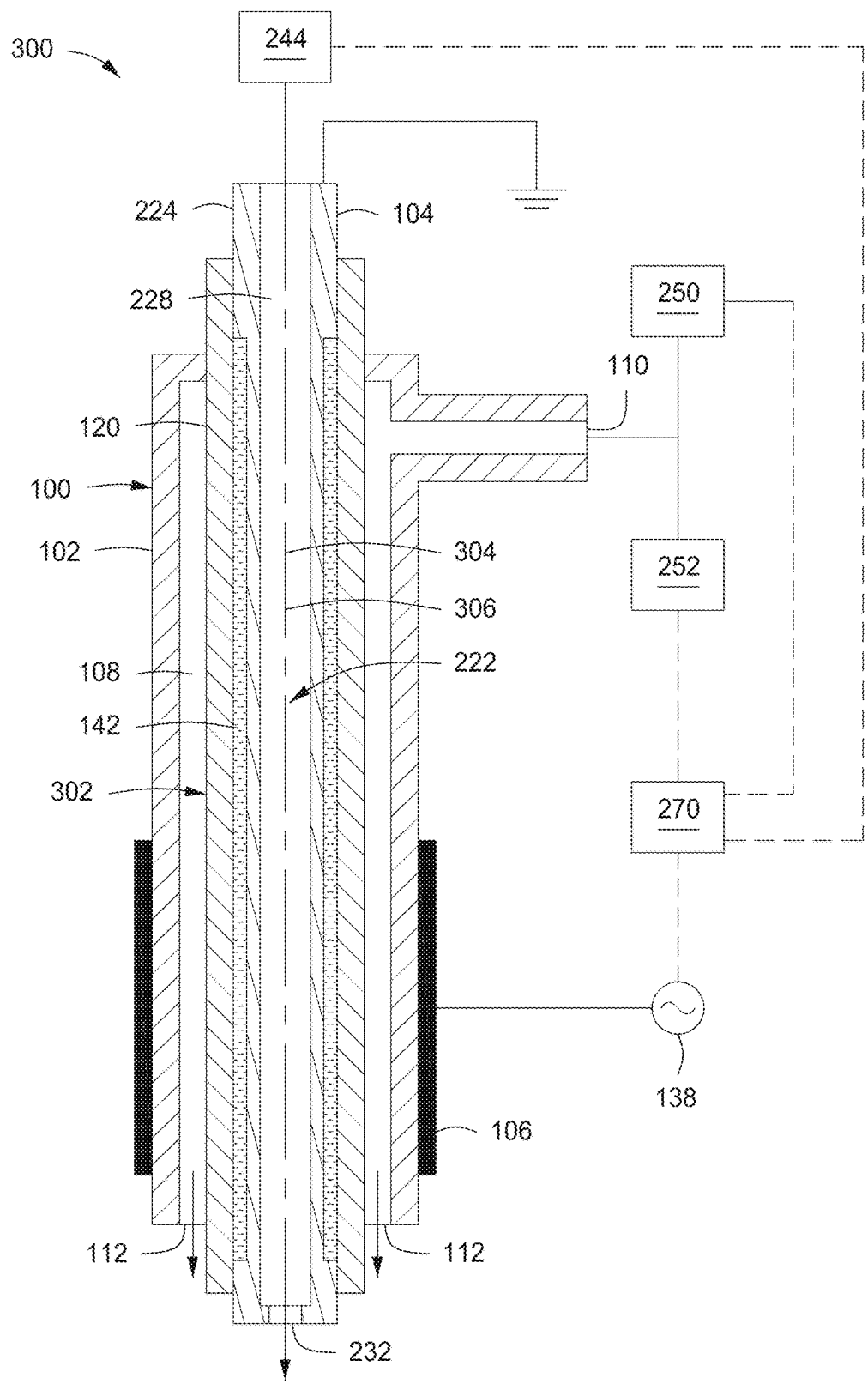
FIG. 10 is a schematic view of a substrate dry cleaning apparatus, according to another aspect of the disclosure.

Referring now to FIGS. 8-10, other aspects of the present disclosure include a reactive species generator combined with a carbon dioxide snow generator to aid in removing both organic and inorganic contaminants from a substrate.

FIG. 8 is a schematic view of a substrate dry cleaning system 220, according to an aspect of the disclosure. The substrate dry cleaning system 220 includes a reactive species generator 100 and a carbon dioxide snow generator 222. The carbon dioxide snow generator 222 includes a second conduit 224 having an inner surface 226 defining a second flow channel 228 therethrough. The second flow channel 228 extends from an inlet 230 of the carbon dioxide snow generator 222 to an exit aperture or outlet 232 of the carbon dioxide snow generator 222. The outlet 232 of the carbon dioxide snow generator and the outlet 112 of the reactive species generator 100 each face a substrate support 234, which supports a substrate 236.

The inner surface 226 of the carbon dioxide snow generator 222 defines a constriction 238 from a first flow area 240 of the second flow channel 228 to a second flow area 242 of the second flow channel 228, such that the second flow area is smaller than the first flow area 240. The second flow channel 228 may receive either liquid or gaseous carbon dioxide from a pressurized carbon dioxide source 244. As a flow of carbon dioxide from the pressurized carbon dioxide source 244 expands downstream of the constriction 238, at least a portion of the carbon dioxide flow may solidify into solid carbon dioxide particles 246.

An inlet 110 of the reactive species generator 100 may receive supply fluid from a pressurized fluid supply 248. The pressurized fluid supply 248 may include a reactant supply 250 that provides chemical species such as, for example, diatomic hydrogen, diatomic oxygen, combinations thereof, or other chemical species known by persons of ordinary skill to produce reactive species in a plasma. Further, the pressurized fluid supply 248 may also include an inert carrier supply 252 that provides inert fluids such as, for example, argon, helium, combinations thereof, or other inert fluids known to persons having ordinary skill in the art. The pressurized fluid supply 248 may include pressure vessels, tubing, pumps, valves, instrumentation, combinations thereof, or other fluid supply components known to persons of ordinary skill.

A longitudinal axis 254 of the reactive species generator 100 may be inclined relative to a surface 235 of the substrate support 234 by a first angle 256. A longitudinal axis 258 of the carbon dioxide snow generator 222 may be inclined relative to the surface 235 of the substrate support by a second angle 260. According to one aspect of the disclosure, the first angle 256 is opposite the second angle 260 with respect to a plane 262 normal to the surface 235 of the substrate support 234.

The substrate dry cleaning system may further include a controller 270 that may be operatively coupled to the pressurized carbon dioxide source 244, the pressurized fluid supply 248, the electrical source 138, or combinations thereof. The controller 270 may be configured to selectively admit carbon dioxide from the pressurized carbon dioxide source 244 into the second flow channel 228 of the carbon dioxide snow generator, selectively admit a gas from the pressurized fluid supply 248 into the first flow channel 108, or combinations thereof. Further, the controller 270 may be configured to selectively energize an electric field between the first electrode 104 and the second electrode 106 via the electrical source 138.

In one aspect of the disclosure, the controller 270 is further configured to pulse flow of carbon dioxide from the pressurized carbon dioxide source 244, pulse a flow of fluid from the pressurized fluid supply 248, or combinations thereof. In another aspect of the disclosure, the controller overlaps pulses of flow from the pressurized carbon dioxide source 244 with pulses of flow from the pressurized fluid supply 248 in time. In yet another aspect of the disclosure, the controller separates pulses of flow from the pressurized carbon dioxide source 244 from pulses of flow from the pressurized fluid supply 248 in time.

Accordingly, both the reactive species and the carbon dioxide snow particles may provide localized cleaning of the substrate 236. Both the carbon dioxide snow and the jet containing reactive species may be simultaneously aimed at the same site on the substrate to promote removal of both organic and inorganic contaminants, or arranged to operate sequentially as the assembly scans over the substrate. The former arrangement may control the temperature of the local site on the substrate being cleaned by sublimation of the carbon dioxide snow, thereby avoiding vaporization or oxidation from a higher temperature reactive species jet while the latter could be used for faster gasification or volatilization of contaminants, particularly organic contaminants.

It will be appreciated that dissociated species exiting the plasma zone 134 of the reactive species generator will include charged species, and that the charged species will be neutralized according to kinetic rates of collisions with other atoms or molecules during a time of flight from the plasma zone 134 to the substrate 236. Further, it will be appreciated that dissociated reactive species my recombine with other species to form less reactive species according to kinetic rates of collisions with other atoms or molecules during a time of flight from the plasma zone 134 to the substrate 236.

According to an aspect of the disclosure, a quantity of charged reactive species incident on the substrate 236 and a quantity of recombined reactive species incident on the substrate 236 are minimized or simultaneously optimized by adjusting time of flight from the plasma zone 134 to the substrate 236 to achieve a desired gasification rate of a contaminant 272. It will be appreciated that the time of flight from the plasma zone 134 to the substrate 236 may be controlled by the controller 270 by adjusting a distance 274 from an exit of the plasma zone 134 to the substrate 236, by adjusting a total volumetric flow rate through the first flow channel 108, or by combinations thereof.

FIG. 9 is a schematic view of a substrate dry cleaning system 220, according to another aspect of the disclosure. In FIG. 9, the second angle 260 between a longitudinal axis 258 of the carbon dioxide snow generator 222 and a surface of either the substrate 236 or a surface 235 of the substrate support 236 is approximately 90 degrees. Such a direct angle between the carbon dioxide snow generator 222 and the substrate 236 may advantageously promote removal of a contaminant 272 from a trench or pit 276 feature defined by the substrate 236.

Further, the reactive species generator 100 may provide either a reactive fluid jet or an inert fluid jet an angle having a component parallel to a surface of the substrate to transport the contaminant 272 away from the trench 276 after being dislodged by the carbon dioxide snow particle stream. In addition, the jet of fluid 278 emanating from the outlet 232 of the carbon dioxide snow generator 222 may be entrained by the jet of fluid 280 emanating from the outlet 112 of the reactive species generator 100.

Thus, locations of the reactive species generator 100 and the carbon dioxide snow generator 222 may be offset and the inert gas available from the inert carrier supply my be applied to provide a drag force on a surface of the substrate 236, a contaminant 272 on the substrate 236, or combinations thereof. Such an arrangement may be advantageous where the carbon dioxide snow may be advantageously directed substantially perpendicular to the substrate surface in order to remove contamination from the bottom of trenches and pits, to avoid shadowing effects. A contaminant particle 272 dislodged from the trench/pit 276 may then be carried away from the substrate 236 by a drag force imparted on the contaminant particle 272 by the reactive species generator gas flow 280 from the side.

FIG. 10 is a schematic view of a substrate dry cleaning apparatus 300, according to another aspect of the disclosure, where a carbon dioxide snow generator 222 is incorporated into an assembly with the reactive species generator 100.

A first conduit 102 defines a first flow channel 108 therein. The first flow channel 108 may be in fluid communication with a reactant supply 250, an inert carrier supply 252, or combinations thereof, and the first flow channel is in fluid communication with an outlet 112. A second conduit 224 defines a second flow channel 228 therein. The second flow channel 228 may be in fluid communication with a pressurized carbon dioxide source 244, or an outlet orifice 232. According to one aspect of the disclosure, a flow area of the outlet orifice 232 defines a constriction flow area that effects the pressure drop or expansion of the carbon dioxide flow.

The second conduit 224 may include an electrically conductive material that acts as a first electrode 104. In one aspect of the disclosure, the second conduit 224 is made from the electrically conductive material. In another aspect of the disclosure, the second conduit 224 includes a coating of the electrically conductive material. The first electrode 104 may be surrounded by the internal member 120. Further, a low melting point metal 142, as discussed previously, may fill a gap between the first electrode 104 and the internal member 120. The gap between the first electrode 104 and the internal member 120 may define a vessel to contain the low melting point metal 142. The internal member 120 may be advantageously made from a material with high oxidation resistance and high-temperature resistance, such as, for example, quartz or sapphire. The internal member 120, the first electrode 104, or combinations thereof may define a all 302 that separates the first flow channel 108 from the second flow channel 228.

In one aspect of the disclosure, the second flow channel 228 is disposed within the first flow channel 108. In another aspect of the disclosure, the first flow channel 108 has an annular cross section. In yet another aspect of the disclosure, the first flow channel 108 has a planar or rectilinear cross section, projecting straight into or out of the page as shown in FIG. 10. In still yet another aspect of the disclosure, the substrate dry cleaning apparatus 300 may have an axisymmetric arrangement, where a longitudinal axis 304 of the first conduit is substantially collinear a longitudinal axis 306 of the second conduit.

According to the compact design of combined carbon dioxide and reactive species sources shown in FIG. 10, the first electrode 104 may be a capillary tube that generates carbon dioxide solid particles as a result of a fluid expansion or pressure drop across the outlet orifice 232. These high velocity particles may have sufficiently high momentum to physically remove organic and inorganic contaminants from a substrate. Because the carbon dioxide jet is narrowly collimated as a result of expansion through a subsonic or a supersonic orifice, the reactive species exiting the outlet 112 of the reactive species generator 100 may be entrained into the carbon dioxide jet, for example, by the Bernoulli Effect, thereby also collimating the jet including reactive species. In addition, the reactive species may be cooled by partial sublimation of the carbon dioxide snow in the flowpath toward the target substrate. Cooled reactive species gas may help prevent undesirable heating of the target substrate. It may be only desirable to limit thermal damage or other physical damage on some substrates, and may be a necessary requirement for other substrates.

Figure 11:
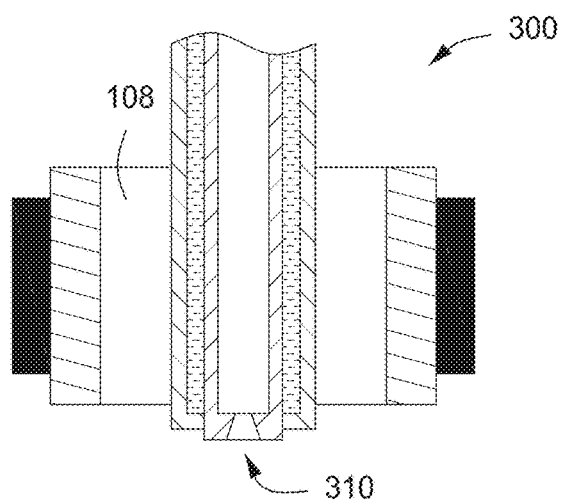
FIG. 11 is a schematic view of a substrate dry cleaning system including a diverging exit nozzle, according to an aspect of the disclosure.
Figure 12:
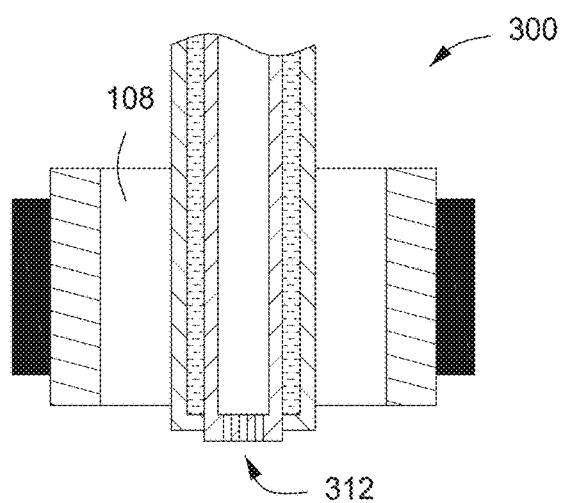
FIG. 12 is a schematic view of a substrate dry cleaning system including an exit nozzle with a plurality of exit orifices, according to an aspect of the disclosure.
Figure 13:
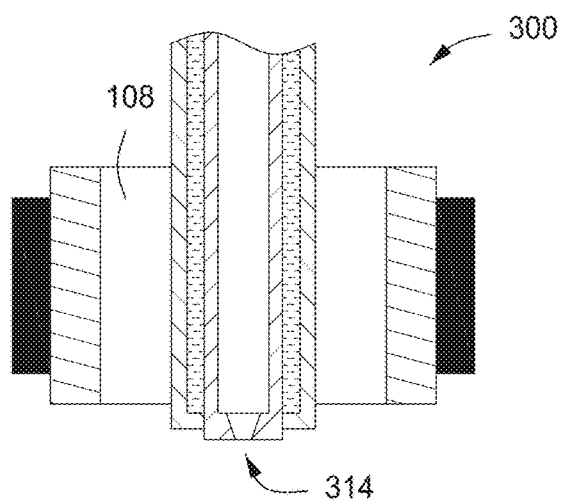
FIG. 13 is a schematic view of a substrate dry cleaning system including a converging exit nozzle, according to an aspect of the disclosure.
Figure 14:
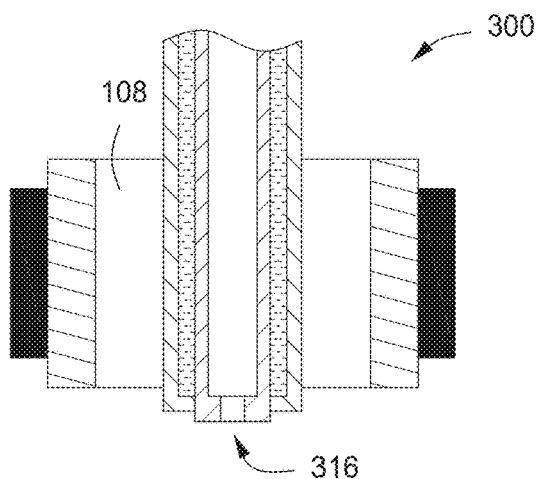
FIG. 14 is a schematic view of a substrate dry cleaning system including a reduced area exit nozzle, according to an aspect of the disclosure.
Figure 15:
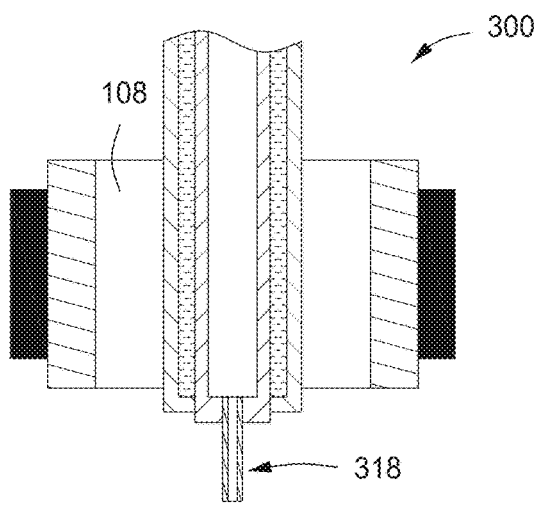
FIG. 15 is a schematic view of a substrate dry cleaning system including a capillary exit tube according to an aspect of the disclosure.
Figure 16:
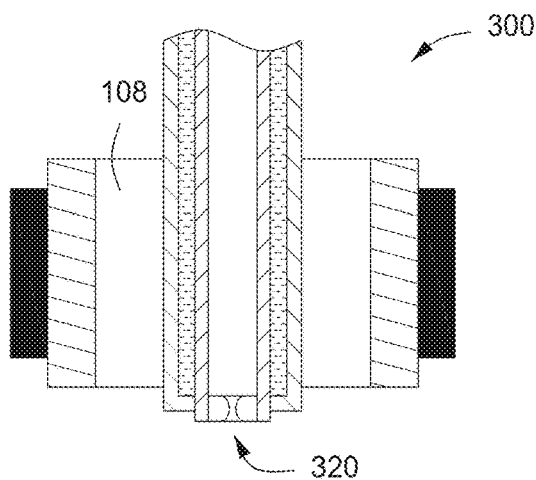
FIG. 16 is a schematic view of a substrate dry cleaning system including a converging-diverging exit, nozzle, according to an aspect of the disclosure.

Referring now to FIGS. 11-16, it will be appreciated that FIG. 11 is a schematic view of a substrate dry cleaning apparatus 300 including a diverging exit nozzle 310, according to an aspect of the disclosure; FIG. 12 is a schematic view of a substrate dry cleaning apparatus 300 including an exit nozzle with a plurality of exit orifices 312, according to an aspect of the disclosure; FIG. 13 is a schematic view of a substrate dry cleaning apparatus 300 including a converging exit nozzle 314, according to an aspect of the disclosure; FIG. 14 is a schematic view of a substrate dry cleaning apparatus 300 including a reduced area exit nozzle 316, according to an aspect of the disclosure; FIG. 15 is a schematic view of a substrate dry cleaning apparatus 300 including a capillary exit tube 318, according to an aspect of the disclosure; FIG. 16 is a schematic view of a substrate dry cleaning apparatus 300 including a converging-diverging exit nozzle 320, according to an aspect of the disclosure.

FIGS. 11-16 show different end cap or exit nozzle designs that may be used to tailor a fluid jet containing carbon dioxide snow or clusters, as part of the compact apparatus shown in FIG. 10, for example. However, it will be appreciated that the exit nozzles illustrated in FIGS. 11-16 could be applied to any carbon dioxide snow generator outlet.

Expanding orifice designs may advantageously provide a supersonic jet of carbon dioxide, whereas straight hole designs may result in a subsonic jet and may be more simple to manufacture. The multiple hole nozzle can be used for cases that need high flux, and the capillary tube end may provide means to bring the substrate 236 close to the source at a wide variety of angles between a longitudinal axis of the apparatus and a surface of the substrate 236. For some applications a focused jet containing reactive species may be desirable, and other applications may benefit from a diffusing or diverging jet. In other cases a converging and diverging nozzle may be used to create a supersonic jet.

The carbon dioxide snow generator 222 can also be used for advantageously generating a jet including carbon dioxide clusters having smaller dimensions and higher velocities than snow, where higher momentum particles are desired. Applications for $CO_2$ cluster cleaning includes removal of defects from high packing density and/or large aspect ratio features that are more susceptible to damage (as discussed previously).

Figure 17:
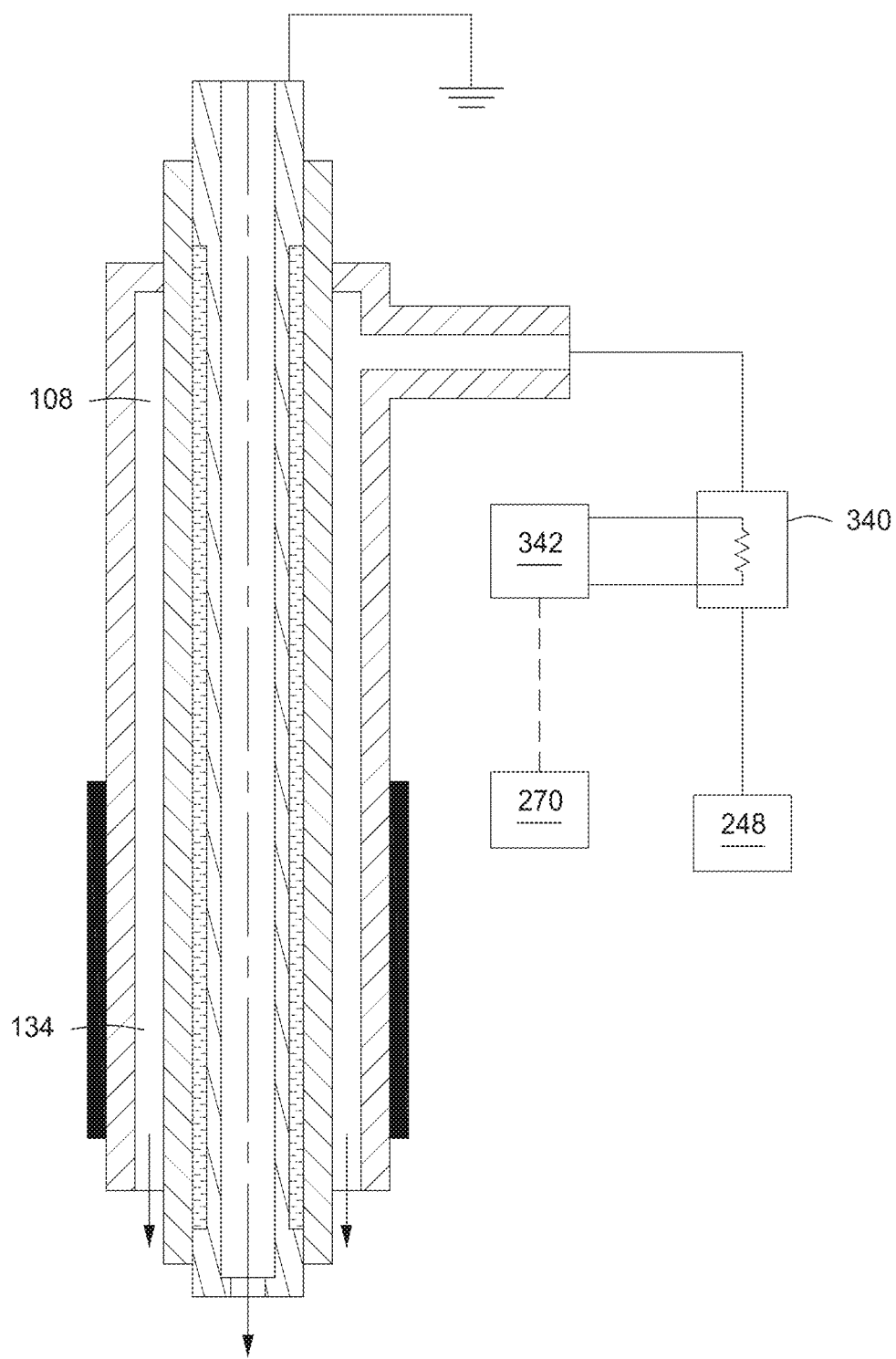
FIG. 17 is a schematic view of a substrate dry cleaning system, according to another aspect of the disclosure.

FIG. 17 is a schematic view of a substrate dry cleaning apparatus 300, according to another aspect of the disclosure. As shown in FIG. 17, the first flow channel 108 may function as heating jacket, even when the plasma zone 134 is not energized, by heating clean and inert, gases such as, nitrogen, helium, combinations thereof, or other inert gas upstream of the first flow channel or within the first flow channel. Inert gas heating may be achieved by the heater 340 disposed downstream of the pressurized fluid supply 248. Further, the controller 270 may be operatively coupled to the heater 340 through a heating power supply 342 to control the temperature, the gas flow rate from the pressurized fluid supply 248, or both, thereby controlling the size of $CO_2$ clusters generated.

In this embodiment, the $CO_2$ snow cleaning or plasma can be used one at a time or in combination. The apparatus may therefore, include a means of turning on/off each portion of the apparatus. The setup parameters (gas flow, power, pressure, etc.) may differ depending on the effect that each portion has on the other and may also depend on the process, the substrate and/or the application.

As an example of the use of the present invention applied to the gasification cleaning of pellicle adhesive residue from a photomask surface is considered. Many of the same considerations are applicable to NGL masks, including EUV and NIL masks, and to other types of contamination, substrates, and materials used in wafer lithography and non-lithography applications.

In the case of a metal thin film on a photomask, oxygen plasma may not be desirable because of potential reaction of the oxygen plasma with the metal thin film. In this case, incompatibility of the target substrate material is a deciding factor for the reactive gas selection. Monatomic hydrogen as a reactive species, however, is compatible with the substrate and can be effective at gasification of the adhesive residue. The quartz inner and outer tube materials are compatible with hydrogen plasma and therefore can be used for the inner outer tube as described previously.

An evaluation of the cleanliness of the plasma source prior to use in cleaning may be beneficial. Such evaluation can be used to verify that the plasma source is ultra-clean and will not add particles or defects to the substrate. In the case of photomask cleaning, an ultra-clean source of reactive species is especially important if the reactive cleaning step is one of the final cleaning steps for the photomask. Verification of the plasma source cleanliness in this case would be required. Adder checking can be performed by inspecting a clean substrate (inert to the reactive species) before and after applying the reactive species generator 100 for a period of time and then counting any defects added. For example, a worst case scenario using the atmospheric hydrogen plasma was applied for about 18.5 minutes on a clean silicon wafer. The result in FIG. 18 shows that the total clustered defect count remained constant at 126 (FIG. 18A), but 24 defects were added and 24 were removed. This illustrates that ultra clean atmospheric hydrogen reactive species generated by a plasma was achieved and verified.

Carbon dioxide low cleaning for pellicle adhesive (or also called pellicle glue) residue removal has many advantages, including the inertness of the carbon dioxide that does not leave any residue on the substrate after its sublimation, contrary to wet cleaning methods. On the other hand, a physical cleaning process may need to be tuned to avoid damage to nearby structures. As the principle feature size shrinks down to single-digit nanometer sizes, the packing density and aspect ratio of the photomask structures increases, and the incentive to avoid damage to these active structures becomes even stronger. In addition, dislodged contaminants are required to be removed away from the substrate through x-y raster scanning the entire substrate with the carbon dioxide spray. Carbon dioxide cryogenic cleaning has been demonstrated to be adder free in production environments down to a 50 nm printability specification on advanced optical masks.

FIG. 19 presents optical profilometer measurements showing pellicle adhesive track removal by $CO_2$ snow using up to 16× scans at 5 mm/s scan rate on mask blanks that have not been UV light exposed during wafer lithography. Relative pellicle adhesive residue volume removal efficiency of 92-98.2% was obtained. This shows that carbon dioxide alone can remove a large amount of the adhesive residue, but it may not be able to remove all of the organic compounds that are utilized in the pellicle adhesive.

Adhesives generally contain complex organic/inorganic compounds. In some embodiments, evaluation of the compatibility of the reactive species with the target material may also be required. Atmospheric oxygen plasma generated reactive species cannot be utilized for optical masks that have a thin metal film, but atmospheric hydrogen plasma generated reactive species can be used.

SEBS adhesive pellicle glue residue track was subjected to atmospheric hydrogen plasma generated reactive species to check its removal capability. FIG. 20 presents photographs before and after reactive species cleaning, demonstrating removal of the adhesive track on a patterned optical mask having an attached pellicle that has received multiple exposures to UV light in production environments. Complete removal of the pellicle in this case required 16× scans at 5 mm/s, similar to the process condition utilized for $CO_2$ in FIG. 19. The pellicle adhesive type in FIGS. 19 and 20 are not the same, but are shown as illustrative examples.

Figure 21:
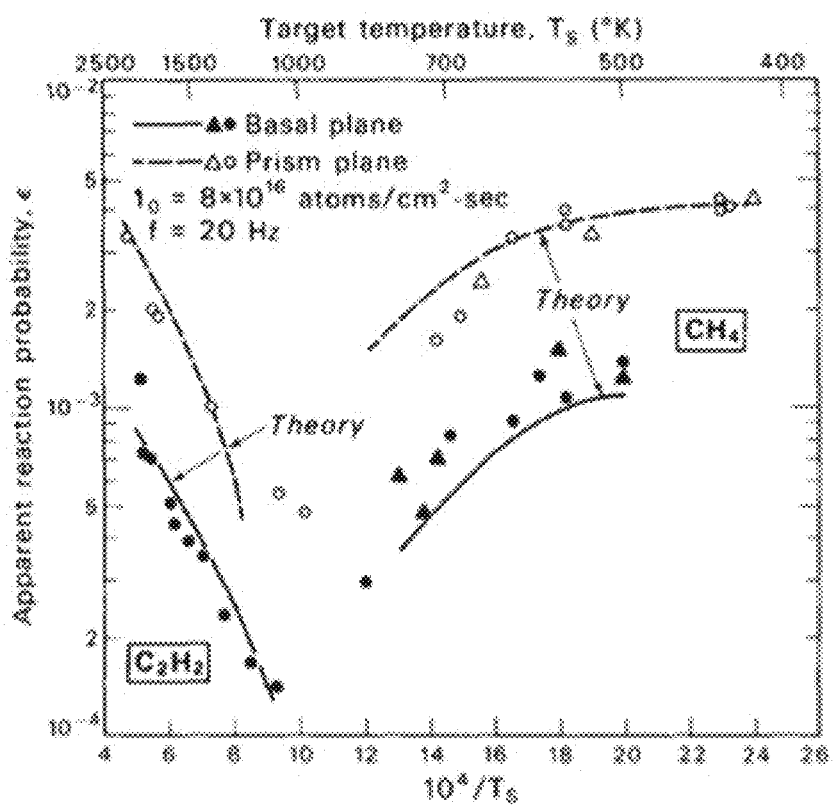
FIG. 21 is a plot of the reaction probability of atomic hydrogen with graphite versus target temperature.

A simplified model for removing photomask pellicle adhesive using hydrogen reactive species generated in a plasma may assume that the limiting step in this process is solely gasification of carbon/hydrocarbon, without breaking bonds and/or forming volatile oxides and nitrides. The detailed gasification of carbon with atomic hydrogen of graphite has been studied using modulated molecular beam mass spectrometry and scanning tunneling microscopy. The reaction probability of atomic hydrogen, $\varepsilon_H$, on a prism plane of graphite slowly reduces with temperature from the 80° F. to 800° F. (300 K to 700 K) range of interest as shown in FIG. 21.

The carbon removal rate, r, of cyanoacrylate, $C_2H_5NO_2$, may be expressed as $$r_{C_2H_5NO_2} = \frac{\eta_{H_2} f_H \varepsilon_H}{14\ s} \quad (1)$$

where s is the beam area on the target substrate, $\eta_{H2}$ is the dissociation probability of molecular hydrogen in the plasma, and $f_H$ is the flow rate of atomic hydrogen impacting the target substrate. The constant 14 comes from a balance of the final products assumed to be $CO_2$, $CH_4$, and $NH_3$. For the flow rat of 1 slm and jet diameter of 8 mm, 30% hydrogen dissociation in the plasma, the rate of gasification of the adhesive film ranges between 50 to 100 nm/s. Therefore, use of hydrogen plasma generated reactive species is expected to produce a reasonable removal rate of many constituents of pellicle adhesive at a useable process rate. The removal rate of pellicle adhesive was experimentally observed to be on the same order as predicted by the theory.

As illustrated above, the removal of pellicle adhesive from a photomask surface may be preferably performed using hydrogen atmospheric plasma generated reactive species or $CO_2$ cryogenic cleaning or even a combination of $CO_2$ cryogenic cleaning with hydrogen plasma generated reactive species. For example, the $CO_2$ cryogenic cleaning may remove the majority of the pellicle adhesive, and the hydrogen reactive species can be used to remove the remaining adhesive residue at an increased throughput. Alternatively, the hydrogen reactive species can be utilized first to volatilize the bulk of the adhesive residue and then $CO_2$ cryogenic cleaning may be used to remove the remnant small volume of residue left behind. This results in lesser residue management on the tool platform in addition to minimizing bounce back/re-deposition of the residue on the mask. Either of these techniques, hydrogen reactive species or $CO_2$ cryogenic cleaning, could be utilized independently but at a reduced number of cleaned substrates per hour.

The reactive gas species emitting from the atmospheric plasma source may be mostly neutralized by the time they reach the target. This is due to the fact that the collision rates are high in near atmospheric pressure. For example, the mean free path of an oxygen atom at one atmosphere and room temperature is about 6×10−4 mm. However, if concerned, the remaining amount of ions can be neutralized by an X-ray source, by applying bias voltage to mitigate possible Electro Static Discharge (ESD) damage, or other charge neutralization methods.

Figure 22:
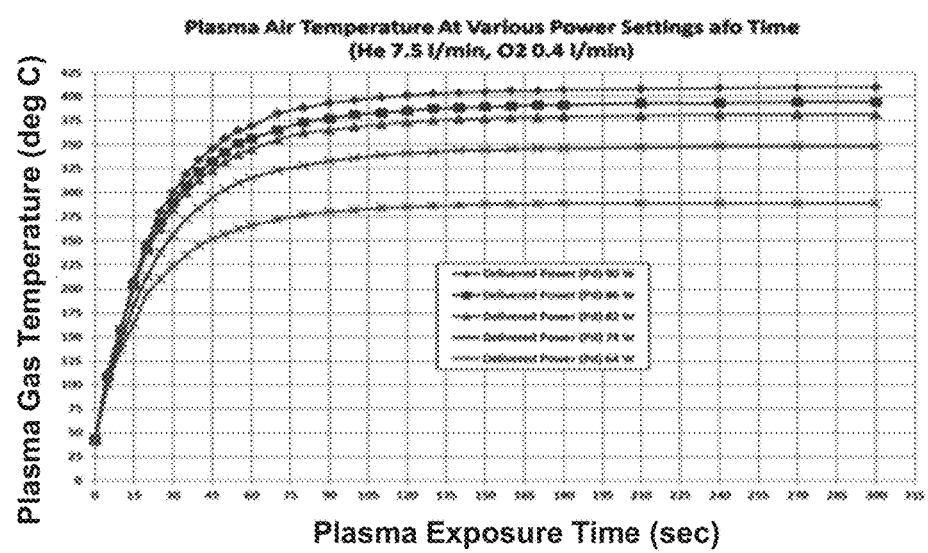
FIG. 22 is a plot of oxygen/helium jet temperature emitted from plasma source at different plasma powers versus plasma exposure time, in accordance with an aspect of the disclosure.

The ions in the atmospheric plasma have low energy close to ambient thermal energy. Unlike convection ion-assisted etching at low pressures, they do not damage the substrate or exhibit sensitivity to the removal rate of organic materials. The target surface temperature, on the other hand, could affect the rate of the removal process. The reaction rate in many cases increases with surface temperature. However, in terms of gasification of carbon, there is a competition between recombination of adsorbed hydrogen atoms to molecules (that end up desorbing) to gasification to make $CH_4$. In this system, as shown in FIG. 22, the gasification rate decreases with temperature due to an increase in recombination of monatomic hydrogen into diatomic hydrogen. This illustrates one of the reasons controlling the concentration of the reacting gases may be desirable in optimizing the disclosed cleaning process.

In addition to pellicle glue residue, masks currently used in lithography and NGL can be contaminated from environmental sources, from manufacturing processes and from normal use in lithographic wafer processing. Aspects of the disclosure may be preferentially used for cleaning masks with contaminations from one or more sources. For example, hydrogen reactive species or $CO_2$ cryogenic cleaning or a combination of $CO_2$ cryogenic cleaning with hydrogen reactive species may be used on mask areas other than local to the pellicle adhesive residue. This may include areas inside the pellicle glue region, including the active area and/or the back side of the mask. The disclosed apparatus and methods may also be used to process areas outside the pellicle glue area to remove contaminations that may affect the registration of the mask on other equipment. Processing of areas outside the pellicle glue area and/or the backside of the mask may be performed with or without a pellicle attached to the mask substrate.

Next generation lithography masks, including Extreme Ultraviolet and Nano-imprint lithography masks, have similar material degradation issues using current cleaning technologies and are also affected by multiple types of contamination. Aspects of the current invention can be beneficial in the cleaning of these mask substrates. As another example, EUV mask leaning may be preferentially accomplished using the ultra-clean plasma generated reactive species and/or $CO_2$ snow cleaning.

For EUV mask technology the main sources of contamination are oxidation and the buildup of carbon contamination layers. Carbon contamination (in film or particle form), due to photon and/or electron enhanced dissociation of residual carbon containing molecules in EUV exposure tools must be addressed. The CD and reflectivity changes caused by carbon (and other) contaminations, influence the printability characteristics of the mask. The extremely high absorption of 13.5 nm wavelength EUV radiation by carbon makes the contamination layer a significant source optical loss.

As discussed for the case of pellicle glue removal, removal EUV substrate carbon contamination may be preferably performed using hydrogen atmospheric plasma or $CO_2$ cryogenic cleaning or a combination of $CO_2$ cryogenic cleaning with hydrogen reactive species. Alternative plasma generated reactive species may be utilized if the mask materials or properties are observed to change under exposure to the reactive species. For example, oxygen or other plasma may be used if the absorber material is compatible with these plasma species. Hydrogen reactive species, as described above can be effective at gasification of the carbon contamination film or particle form. Alternatively, carbon contamination in particle form may be preferentially cleaned using $CO_2$ cryogenic cleaning. A combination of $CO_2$ cryogenic cleaning with the ultra-clean reactive species generator may provide for cleaning of organic and inorganic contamination in film, particle, or other form to clean multiple types of contamination locally or across an entire EUV mask substrate.

For NIL mask technology contamination is likely to include environmentally generated particles as well as residues remaining after fabrication, similar to optical photomask contamination issues. As for photomask contamination leaning, the disclosed apparatus and methods may be applied to clean contaminants using reactive species cleaning or $CO_2$ cryogenic cleaning or a combination of $CO_2$ cryogenic cleaning with reactive species. NIL masks, unlike other masks, are likely to be contaminated with resist residue that remains on the mask after it is used in production, as well as with other contaminants. Resist residue is likely to contain organic species and therefore, may be preferentially cleaned using ultra-clean plasma. In the case of all quartz NIL masks, oxygen reactive species may be preferred to other types because the quartz surface should be unaffected by oxygen reactive species and the removal rate for organic contamination may be greater than for other reactive species.

The disclosed apparatus and methods provide advantages over conventional approaches, as next described.

Aspects of the disclosure may provide superior cleanliness, even for extended time duration applications. Applicants have discovered that aspects of the present disclosure may advantageously clean substrates with zero added particles down to 80 nm after 16 minutes of cleaning exposure.

Aspects of the disclosure may provide cleaning apparatus and methods that do not damage the substrate. Applicants have discovered that aspects of the disclosure enable selection of reactive species that do not react with the substrate (e.g., mask, wafer, etc.) in combination with optimal process conditions, especially with respect to avoiding transmission losses for optical and reflectivity changes of EUV masks. For example, optimal process conditions utilizing hydrogen reactive species may effectively clean while avoiding mask substrate degradation issues on optical masks and EUV masks made from chromium, ruthenium, silicon, and the like.

Aspects of the disclosure may provide selective removal capability, where reactive species are chosen to selectively attack the residue type on the substrate (e.g. mask, wafer, etc.) but not react with the substrate. Thus, depending on the substrate and the type of residue that needs to be removed, oxygen or hydrogen reactive species, or combinations thereof may be applied.

Aspects of the disclosure may provide localized removal capability, such that reactive species may be applied to a very small area of the substrate, and thereby not affect the remaining areas or certain specific sites on the substrate. Localized removal capability offers advantages over vacuum-based system, like plasma ashing, where an entire substrate is subjected to a plasma. The entire substrate can also be cleaned according to aspects of the disclosure by either raster scanning of the substrate or by employing a divergent end attachment to apply the reactive species across the entire substrate area.

Aspects of the disclosure tray provide improved cleaning efficiency. For example, the integrated reactive species and cryogenic carbon dioxide cleaning apparatus and methods disclosed herein may result in a combination of chemical and physical removal, which are both dry processes, and therefore may offer improved cleaning efficiency over either technique performed separately. Depending on the application, $CO_2$ alone may preferentially remove inorganic defects, while plasma-generated reactive species may preferentially remove organic defects, and therefore, the combination acts to remove both types of common contaminants.

Aspects of the disclosure may provide higher dissociation rates of reactive species. The reactive species generator is designed such that a majority of molecular species are dissociated or advanced to excited or volatile states. Indeed, minimizing distances between electrodes, avoiding air gaps, and optimizing ratios of reactive gas to carrier act to promote cleaning effectiveness.

Aspects of the disclosure may help to avoid accelerated or charged species. Indeed, providing sufficient time of flight between the plasma zone 134 and the substrate helps to neutralize ions or charged species that can cause physical damage to the structures/features on the target substrate.

Aspects of the disclosure may help to minimize residue on the substrate, which may result in a cleaner tool and substrate while removing a large volume of residue. Utilizing the reactive species process first for a large volume contamination, like pellicle adhesive residue on optical masks, results in volatilizing of most residues. Then, application of cryogenic $CO_2$ particles may then result in removal of smaller volume residues remaining after the reactive species cleaning. Accordingly, the combination of plasma followed by $CO_2$ may minimize bounce back or re-deposition of residue on the sensitive patterned areas of the mask or wafer substrate.

Aspects of the disclosure may provide improved plasma stability. Indeed, filling gaps around both the cathode and anode reduces arcing due to air gaps, thereby improving plasma stability and producing particle-free reactive species fluid desired for cleaning.

Aspects of the disclosure may provide improved substrate temperature control. The temperature of the reactive species jet incident on the substrate may be controlled to minimize the thermal loading on the substrate during processing. Thus, substrates with features that are sensitive to high temperatures can be safely processed without damage.

Aspects of the disclosure may provide options for customizing fluid jets using in substrate cleaning processes. Adjustable jet size, shape, and flux based on application may be achieved using different types of exit nozzle attachments, such as, for example, capillary tubes, multiple orifices, convergent orifices, divergent orifices, straight orifices, can be utilized with varied dimensions based on the application requirement.

Aspects of the disclosure may provide simplified tool management. For example, the absence of a vacuum requirement, and therefore no need to pump and vent the system, may minimize contamination management issues.

Aspects of the disclosure may provide reduced cost of ownership. Indeed, optimization of process conditions may reduce consumption of reactive gases and reduce residue management burdens without compromising cleaning effectiveness, thereby resulting in lower Cost of Ownership.

Aspects of the disclosure may provide cleaning of various types of defects not limited to pellicle adhesive residue, chemical residue after wet cleaning, carbon contamination, or progressive defects. Indeed the combination of reactive species and carbon dioxide particles may remove contaminants across a new or expanded range of organic and inorganic particles that was not previously possible. Examples include pellicle adhesive residue, chemical residue, and adders left from a wet cleaning process, adders from other process tools, foreign material from unknown sources, carbon contamination from tools, photo-induced carbon deposition, progressive defects or haze.

Aspects of the disclosure may provide minimized hazardous by-products. Indeed, reactive species (e.g. H2, NH3) can be chosen to eliminate hazardous by-products like ozone (e.g., when using activated oxygen as the reactive species). Further, reduced consumption of reactive gases results in smaller quantities of by-products and minimizes extended process time and safety concerns.

Aspects of the disclosure may provide cryogenic carbon dioxide cluster-based cleaning on substrates that have very small contaminants that require removal from flat surfaces or trenches. Carbon dioxide snow size can be reduced to clusters 10-50 nm sizes, in order to remove defects in that corresponding size range. Adjustability of the cryogenic carbon dioxide particle size is helpful for removing particles from the bottom of trenches, contact holes, and features of commensurate size. This technology opens the cleaning window to smaller features, and also smaller sized defects, inclusive of large area but small volume (flat or 2D) defects.

Aspects of the disclosure may provide easy integration with other cleaning techniques. The simple design of apparatus and methods combining ultra-clean atmospheric reactive species and cryogenic carbon dioxide aerosol cleaning, simplifies integration with other complimentary cleaning techniques such as wet cleaning/megasonic nozzle spray, laser shock cleaning, frequency assisted cleaning, and any other global/locally applicable cleaning.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents may be resorted to that fall within the scope of the invention.

We claim:

1. A substrate dry cleaning apparatus, comprising:
    a first conduit defining a first flow channel therein, the first conduit further defining a first exit aperture in fluid communication with the first flow channel;
    a first electrode disposed in a vessel;
    a second electrode facing the first electrode, the first flow channel disposed between the first electrode and the second electrode; and
    a metal including indium, lead, bismuth, or combination thereof filling all of a gap between the first electrode and the vessel.

2. The substrate dry cleaning apparatus of claim 1, wherein the metal is a lead-bismuth eutectic.

3. The substrate dry cleaning apparatus of claim 1, wherein the vessel is comprised of quartz.

4. The substrate dry cleaning apparatus of claim 1, wherein the first conduit is comprised of a high-temperature ceramic selected from the group consisting of quartz and sapphire.

5. The substrate dry cleaning apparatus of claim 1, further comprising a second conduit defining a second flow channel therein, the second flow channel defining a second exit aperture in fluid communication with the second flow channel, an inner surface of the second conduit defining a constriction from a first flow area to a second flow area along a direction of flow toward the second exit aperture, the first flow area being greater than the second flow area.

6. The substrate dry cleaning apparatus of claim 5, wherein the second flow channel is separated from the first flow channel by a wall.

7. The substrate dry cleaning apparatus of claim 6, wherein the wall includes at least a portion of the second conduit.

8. The substrate dry cleaning apparatus of claim 6, wherein the wall includes at least a portion of the first conduit.

9. The substrate dry cleaning apparatus of claim 5, wherein the second conduit is disposed at least partially within the first conduit and arranged coaxially therewith.

10. The substrate dry cleaning apparatus of claim 6, wherein the wall includes at least a portion of the first conduit.

11. The substrate dry cleaning apparatus of claim 5, wherein the second conduit is disposed at least partially within the first conduit and arranged coaxially therewith.

12. A substrate dry cleaning apparatus, comprising:
    a first conduit defining a first flow channel therein, the first conduit further defining a first exit aperture in fluid communication with the first flow channel;
    a first electrode disposed in a vessel;
    a second electrode facing the first electrode, the first flow channel disposed between the first electrode and the second electrode; and
    a metal including indium, lead, bismuth, or combination thereof disposed between the first electrode and the second electrode, wherein the metal fills all of the gap between the first electrode and the vessel.

13. The substrate dry cleaning apparatus of claim 12, wherein the metal is a lead-bismuth eutectic.

14. The substrate dry cleaning apparatus of claim 12, wherein the metal is comprised of nickel.

15. The substrate dry cleaning apparatus of claim 12, wherein the vessel is comprised of quartz.

16. The substrate dry cleaning apparatus of claim 12, further comprising a second conduit defining a second flow channel therein, the second flow channel defining a second exit aperture in fluid communication with the second flow channel, an inner surface of second conduit defining a constriction from a first flow area to a second flow area along a direction of flow toward the second exit aperture, the first flow area being greater than the second flow area.

17. The substrate dry cleaning apparatus of claim 16, wherein the second flow channel is separated from the first flow channel by a wall.

18. The substrate cleaning apparatus of claim 12, wherein the first electrode is formed by coating the internal vessel with a conductive material.

19. The substrate cleaning apparatus of claim 12, wherein the metal has a low atmospheric melting temperature.

20. The substrate cleaning apparatus of claim 1, wherein the vessel is comprised of sapphire.

21. The substrate dry cleaning apparatus of claim 1, wherein the metal is comprised of nickel.

* * * * *